United States Patent
Himeno et al.

(10) Patent No.: US 9,214,628 B2
(45) Date of Patent: Dec. 15, 2015

(54) NONVOLATILE MEMORY ELEMENT, NONVOLATILE MEMORY DEVICE, AND MANUFACTURING METHOD FOR THE SAME

(75) Inventors: Atsushi Himeno, Osaka (JP); Haruyuki Sorada, Okayama (JP); Yukio Hayakawa, Kyoto (JP); Takumi Mikawa, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 231 days.

(21) Appl. No.: 13/810,245

(22) PCT Filed: Nov. 30, 2011

(86) PCT No.: PCT/JP2011/006693
§ 371 (c)(1),
(2), (4) Date: Jan. 15, 2013

(87) PCT Pub. No.: WO2012/073503
PCT Pub. Date: Jun. 7, 2012

(65) Prior Publication Data
US 2013/0112935 A1 May 9, 2013

(30) Foreign Application Priority Data
Dec. 3, 2010 (JP) ................. 2010-270764

(51) Int. Cl.
*H01L 45/00* (2006.01)
*H01L 27/10* (2006.01)
(Continued)

(52) U.S. Cl.
CPC .......... *H01L 45/1253* (2013.01); *H01L 27/101* (2013.01); *H01L 27/2409* (2013.01);
(Continued)

(58) Field of Classification Search
CPC ........... G11C 13/0007; G11C 14/0045; G11C 14/009; G11C 17/165; H01L 27/1052
USPC ........................ 257/3, 4; 365/148, 163, 164
See application file for complete search history.

(56) References Cited

U.S. PATENT DOCUMENTS

| 7,400,006 B1 | 7/2008 | Rinerson et al. |
| 7,439,082 B2 | 10/2008 | Rinerson et al. |

(Continued)

FOREIGN PATENT DOCUMENTS

| JP | 2001-210798 | 8/2001 |
| JP | 2007-027537 | 2/2007 |

(Continued)

OTHER PUBLICATIONS

International Search Report issued Mar. 6, 2012 in International (PCT) Application No. PCT/JP2011/006693.

(Continued)

*Primary Examiner* — Evan Pert
*Assistant Examiner* — Leslie Pilar Cruz
(74) *Attorney, Agent, or Firm* — Wenderoth, Lind & Ponack, L.L.P.

(57) ABSTRACT

A nonvolatile memory element according to the present invention includes a first metal line; a plug formed on the first metal line and connected to the first metal line; a stacked structure including a first electrode, a second electrode, and a variable resistance layer, the stacked structure being formed on a plug which is connected to the first electrode; a second metal line formed on the stacked structure and directly connected to the second electrode; and a side wall protective layer which covers the side wall of the stacked structure and has an insulating property and an oxygen barrier property, wherein part of a lower surface of the second metal line is located under an upper surface of the stacked structure.

17 Claims, 23 Drawing Sheets

(51) Int. Cl.
*H01L 27/24* (2006.01)
*H01L 27/105* (2006.01)

(52) U.S. Cl.
CPC ............ *H01L45/08* (2013.01); *H01L 45/1233* (2013.01); *H01L 45/146* (2013.01); *H01L 45/16* (2013.01); *H01L 45/1625* (2013.01); *H01L 45/1675* (2013.01); *H01L 27/1052* (2013.01)

(56) References Cited

U.S. PATENT DOCUMENTS

| | | | |
|---|---|---|---|
| 7,692,178 | B2 | 4/2010 | Kawashima et al. |
| 7,919,774 | B2 | 4/2011 | Kawashima et al. |
| 8,022,502 | B2 | 9/2011 | Kanzawa et al. |
| 2007/0295950 | A1* | 12/2007 | Cho et al. ............... 257/4 |
| 2009/0014710 | A1 | 1/2009 | Kawashima et al. |
| 2009/0102598 | A1 | 4/2009 | Yamazaki et al. |
| 2009/0121208 | A1 | 5/2009 | Nagashima et al. |
| 2009/0134431 | A1 | 5/2009 | Tabata et al. |
| 2009/0224224 | A1 | 9/2009 | Fujii et al. |
| 2009/0283736 | A1 | 11/2009 | Kanzawa et al. |
| 2009/0296451 | A1 | 12/2009 | Asao |
| 2010/0059730 | A1 | 3/2010 | Ito et al. |
| 2010/0172171 | A1* | 7/2010 | Azuma et al. ............. 365/148 |
| 2010/0200832 | A1* | 8/2010 | Kawano et al. ............... 257/4 |
| 2010/0200852 | A1 | 8/2010 | Kawashima et al. |
| 2010/0202186 | A1 | 8/2010 | Sato et al. |
| 2010/0243980 | A1 | 9/2010 | Fukumizu |
| 2011/0006278 | A1* | 1/2011 | Takahashi .................. 257/4 |
| 2011/0122680 | A1 | 5/2011 | Ikeda et al. |
| 2011/0227017 | A1* | 9/2011 | Yasutake .................. 257/2 |
| 2011/0272664 | A1 | 11/2011 | Tada et al. |
| 2011/0294259 | A1 | 12/2011 | Kanzawa et al. |

FOREIGN PATENT DOCUMENTS

| | | |
|---|---|---|
| JP | 2008-91601 | 4/2008 |
| JP | 2009-123900 | 6/2009 |
| JP | 2009-130138 | 6/2009 |
| JP | 2009-289822 | 12/2009 |
| JP | 2010-186872 | 8/2010 |
| JP | 2010-232214 | 10/2010 |
| WO | 2005/124787 | 12/2005 |
| WO | 2007/102483 | 9/2007 |
| WO | 2008/059701 | 5/2008 |
| WO | 2008/132899 | 11/2008 |
| WO | 2008/149484 | 12/2008 |
| WO | 2008/155832 | 12/2008 |
| WO | WO 2009096363 A1 * | 8/2009 |
| WO | 2010/079816 | 7/2010 |
| WO | 2010/119671 | 10/2010 |

OTHER PUBLICATIONS

I.G. Black et al., "Highly Scalable Non-volatile Resistive Memory using Simple Binary Oxide Driven by Asymetric Unipolar Voltage Pulses", IEEE International Electron Devices Meeting, IEDM Technical Digest, Dec. 13-15, 2004, p. 587.

Office Action issued Mar. 26, 2015 in corresponding Chinese Patent Application No. 201180035067.3 (with partial English translation).

English translation of paragraphs [0033]-[0087] of WO 2008/155832, Dec. 24, 2008.

* cited by examiner

NONVOLATILE MEMORY ELEMENT, NONVOLATILE MEMORY DEVICE, AND MANUFACTURING METHOD FOR THE SAME

TECHNICAL FIELD

The present invention relates to a variable resistance nonvolatile memory element including a variable resistance element having a resistance value which changes under application of an electrical pulse, to a nonvolatile memory device which uses a plurality of such nonvolatile memory elements, and to methods of manufacturing the variable resistance element and the nonvolatile memory device.

BACKGROUND ART

In recent years, along with the development of digital technology, functions of electronic devices such as portable information devices and information home appliances have been further improved. As these electronic devices become more sophisticated in functionality, finely structured, high speed semiconductor elements to be used in the electronic devices have been rapidly developed. Among all, application of a nonvolatile memory having a large capacity represented by the flash memory has been rapidly expanding. In addition, research and development of Resistive Random Access Memory (ReRAM) having a variable resistance element as a new next-generation nonvolatile memory to replace the flash memory has advanced. Here, a variable resistance element is an element which has characteristics that a resistance value reversibly changes according to an electrical signal, and which can store information corresponding to the resistance value in a nonvolatile manner.

The resistive random access memory uses a variable resistance layer having a variable resistance value as a memory element. Application of an electrical pulse (for example, a voltage pulse) to the variable resistance layer causes the resistance value to change from a high resistance state to a low resistance state, or from a low resistance state to a high resistance state. In this manner, the resistive random access memory stores data. In the above process, it is necessary to clearly distinguish two values in a low resistance state and a high resistance state, to cause a change between a low resistance state and a high resistance state stably and quickly, and to hold the two values in a nonvolatile manner.

As an example of such a nonvolatile memory element, a nonvolatile memory element using a variable resistance layer in which transition metal oxides having different oxygen content atomic percentages are stacked has been proposed. For example, PTL 1 discloses a technology which stabilizes resistance change phenomenon by selectively causing an oxidation reaction or a reduction reaction at an electrode interface to come into contact with a transition metal oxide layer having a high oxygen content atomic percentage.

FIG. 23 is a cross-sectional view illustrating a variable resistance nonvolatile memory device 50 having a nonvolatile memory element 55 described in PTL 1. In the nonvolatile memory device 50 illustrated in FIG. 23, a first line 61 is formed on a substrate 60, and a first interlayer insulating layer 62 is formed to cover the first line 61. In addition, a first plug 64 connected to the first wiring 61 is formed so as to penetrate through the first interlayer insulating layer 62. Furthermore, the nonvolatile memory element 55 is formed on the first interlayer insulating layer 62 so as to cover the first plug 64. The nonvolatile memory element 55 comprises a lower electrode 65, a variable resistance layer 66, and an upper electrode 67. A second interlayer insulating layer 68 is formed so as to cover the nonvolatile memory element 55. A second plug 70 is formed so as to penetrate through the second interlayer insulating layer 68. The second plug 70 connects between the upper electrode 67 and a second line 71.

The variable resistance layer 66 has a stacked structure including a first variable resistance layer 66$x$ and a second variable resistance layer 66$y$. The first variable resistance layer 66$x$ and the second variable resistance layer 66$y$ comprise transition metal oxide of the same type. The oxygen content atomic percentage of the transition metal oxide comprised by the second variable resistance layer 66$y$ is higher than the oxygen content atomic percentage of the transition metal oxide comprised by the first variable resistance layer 66$x$.

With the above-described structure, when a voltage is applied to the nonvolatile memory element 55, most of the voltage is applied to the second variable resistance layer 66$y$ having a high oxygen content atomic percentage and exhibiting a higher resistance value. Oxygen contributing to a reaction is abundantly present in the vicinity of the second variable resistance layer 66$y$. Thus, an oxidation reaction or a reduction reaction selectively occurs in the vicinity of the interface between the upper electrode 67 and the second variable resistance layer 66$y$, therefore, a resistance change can be stably achieved.

NPL 1 discloses a nonvolatile memory comprising a 1T1R (1 transistor 1 resistance) memory cell which uses transition metal oxide as a variable resistance layer. A transition metal oxide thin film is normally an insulating material. Thus, in order to change a resistance value with a pulse, the variable resistance layer is broken in an initial state (initial break), thereby forming a conductive path having a switchable resistance value between a high resistance state and a low resistance state. It is to be noted that "initial break (initial breakdown)" is a process which is performed on a variable resistance layer after manufacture to make a transition to a state in which the variable resistance layer can reversibly change between a high resistance state and a low resistance state according to a voltage value applied (or the polarity of a voltage applied). Specifically, the initial breakdown is to apply a voltage (initial breakdown voltage) higher than a write voltage to a variable resistance layer having an extremely high resistance value after manufacture or to a nonvolatile memory element including the variable resistance layer. The initial breakdown causes the variable resistance layer to make a transition to a state in which the variable resistance layer can reversibly change between a high resistance state and a low resistance state, while the resistance value of the variable resistance layer is reduced.

CITATION LIST

Patent Literature

[PTL 1] WO 2008/149484
[PTL 2] WO 2008/059701

Non Patent Literature

[NPL 1] I. G. Baek et al., IEDM 2004, p. 587

SUMMARY OF INVENTION

Technical Problem

However, when the upper electrode of a variable resistance element and an upper layer line are directly connected, without use of a plug, to each other in the configuration of FIG. 23, there is a concern that a leak path may be formed, through which current flows to the variable resistance layer directly from the upper layer line not via the upper electrode of the variable resistance element.

Once such a leak path is formed, through which current flows to the variable resistance layer not via the upper electrode, a sufficient breakdown voltage is not applied to the variable resistance layer. Accordingly, an initial breakdown may not occur in the variable resistance element, and thus the rate of successful initial breakdown reduces. Consequently, the yield is reduced.

Thus, the conventional nonvolatile memory element has a problem in that the initial breakdown voltage varies due to the formation of a leak path in the process of line formation.

The present invention has been made in order to solve the above-described problem, and it is an object of the invention to provide a nonvolatile memory element, a nonvolatile memory device, and a method of manufacturing the nonvolatile memory element and the nonvolatile memory device which are capable of preventing the formation of a leak path in the process of line formation.

Solution to Problem

In order to achieve the above object, a nonvolatile memory element according to an aspect of the present invention includes a first electrode, a second electrode, and a variable resistance layer (i) which is interposed between the first electrode and the second electrode, and (ii) comprises an oxygen-deficient transition metal oxide, and (iii) which reversibly changes between a high resistance state and a low resistance state in which a resistance value lower than a resistance value in the high resistance state, according to an electrical signal applied between the first electrode and the second electrode, the nonvolatile memory element including: a first metal line; a plug which is formed on the first metal line and connected to the first metal line; a stacked structure which is formed on the plug, and includes the first electrode, the second electrode, and the variable resistance layer, the plug being connected to one of the first electrode and the second electrode; a second metal line which is formed on the stacked structure, and is directly connected to the other of the first electrode and the second electrode; and a side wall protective layer which covers a side wall of the stacked structure, the side wall protective layer having an insulating property and an oxygen barrier property, wherein part of a lower surface of the second metal line is located under the upper surface of the stacked structure.

With this configuration, in a nonvolatile memory element according to an aspect of the present invention, the side wall of the stacked structure including a variable resistance element is covered by the side wall protective layer. Thus, in a nonvolatile memory element according to an aspect of the present invention, the formation of a leak path between the second metal line and the variable resistance layer can be prevented in the process of line formation.

The side wall protective layer may comprise any one of an oxide, a nitride and an oxynitride.

The side wall protective layer may comprise any one of a silicon nitride, an aluminum oxide, and a titanium oxide.

The variable resistance layer may includes: a first variable resistance layer comprising the transition metal oxide; and a second variable resistance layer comprising the transition metal oxide and having an oxygen content atomic percentage higher than an oxygen content atomic percentage of the first variable resistance layer.

The variable resistance layer may include: a first variable resistance layer comprising the transition metal oxide; a second variable resistance layer comprising the transition metal oxide and having an oxygen content atomic percentage higher than an oxygen content atomic percentage of the first variable resistance layer; and a resistance layer which is formed on side walls of the first variable resistance layer and the second variable resistance layer, the resistance layer comprising the transition metal oxide and having an oxygen content atomic percentage higher than an oxygen content atomic percentage of the first variable resistance layer.

The variable resistance layer may comprise any one of an oxygen-deficient tantalum oxide, an oxygen-deficient hafnium oxide, and an oxygen-deficient zirconium oxide.

With this configuration, an effective cross-sectional area of the variable resistance layer, through which current flows at the time of an initial breakdown, is reduced. Consequently, the density of current which flows through the variable resistance layer increases, and thus the initial breakdown voltage can be reduced. Furthermore, a variation in the density which flows through the variable resistance layer is reduced, and thus reduction in the yield of the nonvolatile memory element can be prevented and the reliability can be increased.

The second electrode may comprise any metal of iridium, platinum, palladium, copper, and tungsten, or a combination or an alloy thereof, and a cross-sectional shape of the stacked structure is a trapezoid in which an angle formed by an extension line of the upper surface of the stacked structure and the side wall of the stacked structure is less than 90°.

With this configuration, in a nonvolatile memory element according to an aspect of the present invention, the cross-sectional shape of the stacked structure is a trapezoid. Thus, when the side wall protective layer is formed by using, for example, plasma CVD or sputtering which has less step coverage capability than low pressure CVD (Chemical Vapor Deposition), the side wall protective layer is easily formed on the side surface of the stacked structure in contrast to the case where the stacked structure has a rectangular cross-sectional shape. Consequently, the side surface of the stacked structure can be covered without a breakdown by the side wall protective layer.

Particularly, when sputtering is used, the film formed at the shoulder part of the upper end of a stacked structure tends to be thick, i.e., so-called overhang shape is formed. However, such a formation of an overhang shape at the shoulder part of the upper end of the stacked structure is effective for prevention of formation of a leak path due to a contact between the second metal line and the side surface of the variable resistance layer in the process of forming the second metal line.

Thus, the nonvolatile memory element according to an aspect of the present invention is capable of further inhibiting oxidation at the side surface of the variable resistance layer, and preventing the formation of a leak path between the second metal line and the side surface of the variable resistance layer.

In addition, a nonvolatile memory device according to an aspect of the present invention includes a plurality of the nonvolatile memory elements, the nonvolatile memory device including: a plurality of first metal lines which include the first metal line and extend in a first direction; a plurality of second metal lines which include the second metal line and extend in a second direction crossing the first direction; a plurality of plugs including the plug; and a plurality of dot-shaped stacked structures including the stacked structure, wherein each of pairs of the plugs and the stacked structures is formed at corresponding one of three-dimensional cross-points of the first metal lines and second metal lines, and the side wall protective layer covers side walls of the stacked structures.

The side wall protective layer may be separately formed for each of the stacked structures.

With this configuration, the side wall protective layer is separately formed for each stacked structure including a variable resistance element, and thus the side wall protective layer is not present in the region where no stacked structure is formed. Therefore, dry etching process can be easily performed to form a drawer contact for connecting the first metal line and the second metal line in the region where no stacked structure is formed.

The stacked structure may further include: a semiconductor layer formed between the first electrode and the variable resistance layer and connected to the first electrode; and an intermediate electrode interposed between the semiconductor layer and the variable resistance layer, the first electrode, the semiconductor layer, and the intermediate electrode may be included in a diode element, and the intermediate electrode, the variable resistance layer, and the second electrode may be included in a variable resistance element.

With this configuration, an occurrence of write disturb between adjacent variable resistance elements can be reliably prevented. Thus, the nonvolatile memory device according to an aspect of the present invention can achieve a highly integrated variable resistance nonvolatile memory device having a large capacity without disposing a switching device such as a transistor.

In the present description, a diode element is defined as a two-terminal element having nonlinear electrical resistance characteristics such that the electrical resistance is extremely high when an applied voltage is lower than or equal to a critical voltage, whereas when an applied voltage exceeds the critical voltage, the electrical resistance reduces suddenly, so that a huge current flows.

As a two-terminal element having such characteristics, an MSM (Metal-Semiconductor-Metal) diode, an MIM (Metal-Insulator-Metal) diode, and a varistor are known, for example.

The stacked structure including a variable resistance element and a diode element is covered by the side wall protective layer. Thus it is possible to inhibit oxidation initiated at the side wall of a semiconductor layer due to film formation process and heat treatment of the interlayer insulating layer in the manufacturing process. Therefore, reduction in the effective cross-sectional area of the diode element can be reduced. Consequently, reduction in the capacity of the current which can flow through the diode element can be prevented, and thus a nonvolatile memory device including a diode element having a large current capacity can be achieved.

The semiconductor layer may comprise a nitrogen-deficient silicon nitride.

The stacked structure may further include a semiconductor layer formed between the first electrode and the variable resistance layer and connected to the first electrode and the variable resistance layer, and the first electrode and the variable resistance layer each comprise a material having a work function higher than a work function of the semiconductor layer.

With this configuration, an occurrence of write disturb between adjacent variable resistance elements can be reliably prevented. Thus, the nonvolatile memory device according to an aspect of the present invention can achieve a highly integrated variable resistance nonvolatile memory device having a large capacity without disposing a switching device such as a transistor.

The stacked structure including a variable resistance element and a diode element is covered by the side wall protective layer. Thus, it is possible to inhibit oxidation of the side wall of a semiconductor layer due to film formation process and heat treatment of the interlayer insulating layer in the manufacturing process. Therefore, reduction in the effective cross-sectional area of the diode element can be reduced. Consequently, reduction in the capacity of the current which can flow through the diode element can be prevented, and thus a nonvolatile memory device including a diode element having a large current capacity can be achieved.

Furthermore, the stacked structure can be formed with four layers, and thus the stacked structure can be made simple and thin. Accordingly, the influence of parasitic resistance can be reduced, and thus current density can be easily controlled. In addition, because fabrication accuracy also increases, a variation in dimensions can be reduced. Consequently, a variation in the density which flows through the stacked structure can be reduced, and thus reduction in the yield of the nonvolatile memory device can be prevented and the reliability can be increased.

Part of the lower surface of the second metal line may be located under an upper surface of the variable resistance layer.

With this configuration, even when no side wall protective layer is provided to cause a leak path to be formed between the second metal line and the variable resistance layer, the formation of a leak path can be prevented.

A method of manufacturing a nonvolatile memory element according to an aspect of the present invention includes a first electrode, a second electrode, and a variable resistance layer (i) which is interposed between the first electrode and the second electrode, and (ii) comprises an oxygen-deficient transition metal oxide, and (iii) which reversibly changes between a high resistance state and a low resistance state in which a resistance value lower than a resistance value in the high resistance state, according to an electrical signal applied between the first electrode and the second electrode, the method including: a first step of forming a first metal line; a second step of forming a plug connected to the first metal line; a third step of forming a stacked structure on the plug, the stacked structure including the first electrode, the second electrode, and the variable resistance layer, and the plug being connected to one of the first electrode and the second electrode; a fourth step of forming a side wall protective layer which covers a side wall of the stacked structure, the side wall protective layer having an insulating property and an oxygen barrier property; and a fifth step of forming a second metal line on the stacked structure, the second metal line being directly connected to the other of the first electrode and the second electrode, wherein part of a lower surface of the second metal line is located under the upper surface of the stacked structure.

By the above manufacturing method, the side wall of the variable resistance layer is covered by the side wall protective layer. Therefore, even when the bottom of the line groove for embedding the second metal line is grooved to a depth so as to expose the side wall of the variable resistance layer in the process of forming the second metal line, the second metal line can be prevented from coming into contact with the variable resistance layer. The second metal line normally is in contact with the upper electrode (for example, the second electrode) only. Therefore, it is possible to prevent the formation of a leak path through which current flows from the second metal line to the variable resistance layer not via the upper electrode. Accordingly, a sufficient breakdown voltage is applied to the variable resistance layer, and thus the rate of successful initial breakdown and the yield of the variable resistance element can be increased. Consequently, a highly reliable nonvolatile semiconductor memory device having excellent reproducibility of variable resistance characteristics can be manufactured.

Furthermore, because the side wall of the stacked structure is covered by the side wall protective layer, oxidation at the side surface of the variable resistance layer can be inhibited, the oxidation being caused by a film formation process and a heat treatment process for the interlayer insulating layer in a manufacturing process after the formation of the variable resistance element. Therefore, a variation in the effective cross-sectional area of the variable resistance layer can be reduced. Consequently, the nonvolatile memory element according to an aspect of the present invention can reduce a variation in the initial breakdown voltage, and thus reduction in the yield can be reduced.

A method of manufacturing a nonvolatile memory device according to an aspect of the present invention includes a plurality of the nonvolatile memory elements, the method including the method of manufacturing the nonvolatile memory element, the method of manufacturing a nonvolatile memory device, including: forming a plurality of first metal lines which include the first metal line and extend in a first direction, in the first step of forming of the first metal line; forming a plurality of second metal lines which include the second metal line and extend in a second direction crossing the first direction, in the fifth step of forming of the second metal line; forming each of a plurality of plugs including the plug at a corresponding one of locations of three-dimensional cross-points of the first metal lines and second metal lines in the second step of forming of the plug; forming each of a plurality of stacked structures including the stacked structure at a corresponding one of the locations in the third step of forming of the stacked structure; and forming the side wall protective layer which covers side walls of the stacked structures in the fourth step of forming of the side wall protective layer.

The forming of the fourth side wall protective layer may include: forming a film of the side wall protective layer; and removing the side wall protective layer other than part of the side wall protective layer corresponding to the side wall of the stacked structure.

By the above manufacturing method, the side wall protective layer is separately formed for each stacked structure including a variable resistance element. Thus, the side wall protective layer is not present in the region where a stacked structure is not formed. Therefore, dry etching process can be easily performed to form a drawer contact for connecting the first metal line and the second metal line in the region where no stacked structure is formed.

The present invention may be implemented not only as the nonvolatile memory element and the nonvolatile memory device described above, but also as an integrated circuit (LSI) which achieves the nonvolatile memory element and the nonvolatile memory device.

Advantageous Effects of Invention

As described above, the present invention can provide a nonvolatile memory element, a nonvolatile memory device, and a method of manufacturing the nonvolatile memory element and the nonvolatile memory device which are capable of preventing the formation of a leak path in the process of line formation.

DESCRIPTION OF EMBODIMENTS

It is presumed that in a variable resistance nonvolatile memory element (hereinafter, also simply referred to as a nonvolatile memory element), a conductive path formed by an initial breakdown has a filament-like shape. The horizontal cross-sectional area of the conductive path is much smaller than the horizontal cross-sectional area of the variable resistance element. Furthermore, it cannot be determined in which part of a variable resistance layer the conductive path is formed.

Thus, in a conventional nonvolatile memory element, there is a problem in that an initial breakdown voltage required for forming a conductive path varies in a plurality of variable resistance elements.

It has been found that when iridium or an alloy of iridium and other precious metal is used as an electrode material, for example, the initial breakdown voltage changes sensitively to the dimensions of the variable resistance element. Therefore, the initial breakdown voltage significantly varies particularly in variable resistance elements in which such an electrode material is used.

An oxygen-deficient transition metal oxide comprising a variable resistance layer is easily oxidized. Thus, the variable resistance layer is oxidized from the side surface by oxidation due to heat, plasma, and material gas in a process of forming an interlayer insulating layer for covering the variable resistance layer, and oxygen diffusion from the interlayer insulating layer to the variable resistance layer, which is caused by the subsequent heat treatment. Accordingly, an insulating oxide layer is formed around the side surface of the variable resistance layer.

Because the oxidation at the side wall of the variable resistance layer in such a manufacturing process is less controllable, the degree of the oxidation varies in the variable resistance elements. Therefore, the initial breakdown voltage significantly varies due to a variation in the effective cross-sectional area through which the current flows at the time of the initial breakdown of the variable resistance layer.

Thus, the conventional nonvolatile memory element has a first problem that the initial breakdown voltage varies due to a variation in the effective cross-sectional area of the variable resistance layer.

Figure 23:
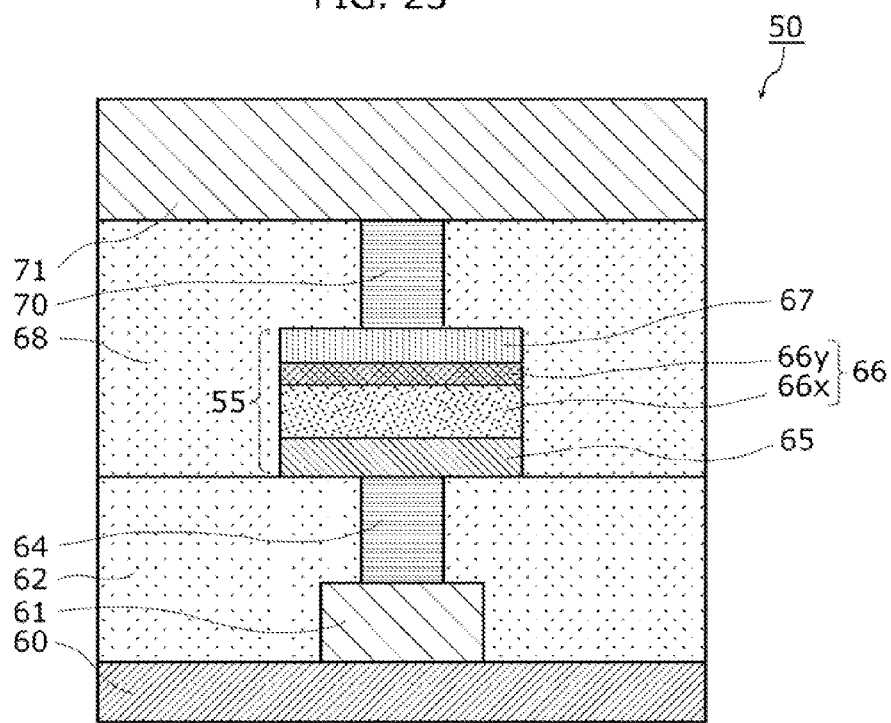
FIG. 23 is a cross-sectional view illustrating a configuration example of a conventional nonvolatile memory element.

In addition, in the case where a configuration is adopted in which an upper electrode 67 and an upper layer line 71 of the variable resistance element are directly connected, without use of a plug 70, to each other in the configuration of FIG. 23, the following problem arises as described above.

Even when the line width of the upper layer line 71 is narrower than the line width of the upper electrode 67 of the variable resistance element, and no misalignment has occurred in the process of forming a line groove for embedding the upper layer line 71 into an interlayer insulating layer 68 formed on a variable resistance element 55, the upper layer line 71 being connected to the upper electrode 67 of the variable resistance element, the bottom of the line groove formed may be grooved to a depth so as to expose the side wall of a variable resistance layer 65 due to a variation in thickness of the interlayer insulating layer 68 in the variable resistance element 55 (FIG. 24) when the line longitudinal direction of the upper layer line 71 (the direction parallel to the paper surface of FIG. 24) is taken into consideration. In this case, there is a concern that a leak path may be formed, through which current directly flows into the variable resistance layer not through the upper electrode of the variable resistance element from the upper layer line.

When such a leak path, in which current flows into the variable resistance layer not through the upper electrode, is formed, a sufficient breakdown voltage is not applied to the variable resistance layer. In this manner, the initial breakdown may not occur in the variable resistance element, and thus the rate of successful initial breakdown reduces. Consequently, the yield is reduced.

Thus, the conventional nonvolatile memory element has a second problem that the initial breakdown voltage varies due to the formation of a leak path in the process of line formation.

Thus, the below-described variable resistance element and a method of manufacturing the variable resistance element according to an embodiment of the present invention is able to reduce a variation in the effective cross-sectional area of the variable resistance layer, and to prevent formation of a leak path in the line formation process, thereby reducing a variation in the initial breakdown voltage.

Hereinafter, a variable resistance nonvolatile memory element (hereinafter also simply referred to as a nonvolatile memory element) and a method of manufacturing the nonvolatile memory element according to an embodiment of the present invention will be described with reference to the accompanying drawings. The components labeled with the same reference symbols in the drawings may not be described below. The drawings schematically illustrate the components for the purpose of facilitating the understanding of the invention, and the shapes and dimensions are not accurately drawn.

Each of the embodiments described below is a preferable example of the present invention. The numerical values, shapes, materials, components, arrangement positions and connection topologies of the components, steps, the order of the steps which are shown in the following embodiments are examples, and not intended to limit the present invention. The present invention is limited only by the claims. Therefore, the components out of the components in following embodiments, which are not described in the independent claim which provides the most generic concept of the present invention are not necessarily required to achieve the object of the present invention, but are described as the components for a more preferable embodiment.

Embodiment 1

Figure 1:
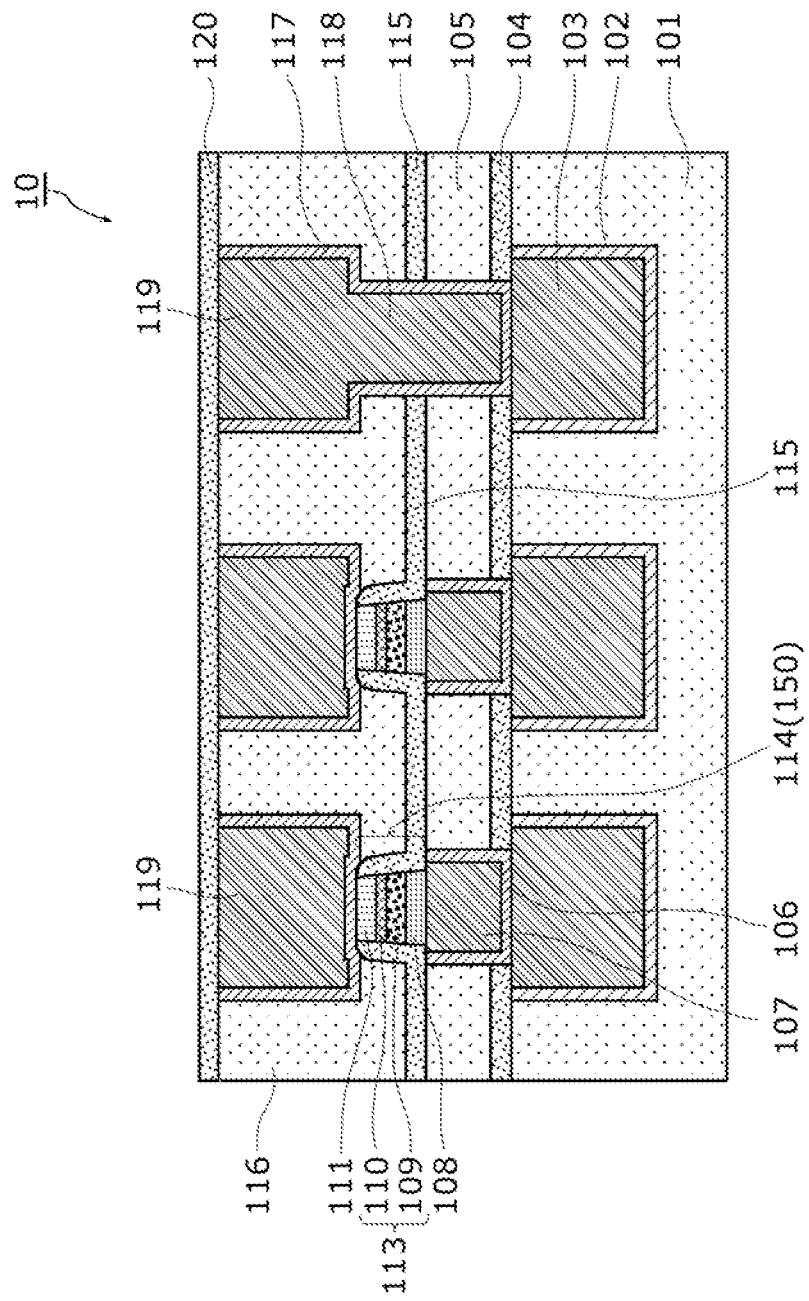
FIG. 1 is a cross-sectional view illustrating a configuration example of a nonvolatile memory element according to Embodiment 1 of the present invention.

FIG. 1 is a cross-sectional view illustrating a configuration example of a nonvolatile memory element 10 according to Embodiment 1 of the present invention.

FIG. 1 illustrates the nonvolatile memory element 10 which is a portion called a memory cell array or a memory core section in a typical semiconductor memory device. The nonvolatile memory element 10 may include such a memory cell array, and a drive circuit for driving the memory cell array.

The nonvolatile memory element 10 changes the resistance state of a desired variable resistance element 114 by supplying from the drive circuit electrical pulses for writing data to the memory cell array. The nonvolatile memory element 10 reads the resistance state of a desired variable resistance element 114 by supplying from the drive circuit electrical pulses for reading data from the memory cell array.

A first interlayer insulating layer 101 is formed on a semiconductor substrate (not illustrated) in which e.g., a transistor is formed and comprises silicon oxide, for example.

A first metal line 103 is formed in the first interlayer insulating layer 101, and is a copper line, for example. The first metal line 103 may comprise a metal other than copper (for example, aluminum).

A first liner layer 104 is formed on the first interlayer insulating layer 101 including the first metal line 103, and comprises silicon nitride (30 to 200 nm in thickness), for example.

A second interlayer insulating layer 105 is formed on the first liner layer 104, and comprises silicon oxide (100 to 500 nm in thickness), for example.

A Plug 107 (50 to 200 nm in diameter) is formed in the first liner layer 104 and the second interlayer insulating layer 105, and is electrically connected to the first metal line 103.

The variable resistance element 114 is formed on the second interlayer insulating layer 105 and is connected to the plug 107. The variable resistance element 114 is formed as a stacked structure 150 in a dot shape.

The variable resistance element 114 includes a first electrode 108, a variable resistance layer 113, and a second electrode 111.

The variable resistance layer 113 is sandwiched between the first electrode 108 and the second electrode 111. The variable resistance layer 113 comprises an oxygen-deficient transition metal oxide, and changes reversibly between a high resistance state and a low resistance state in which the resistance value is lower than the resistance value in the high resistance state, according to an electrical signal applied between the first electrode 108 and the second electrode 111. The variable resistance layer 113 has a stacked structure including the first variable resistance layer 109 and the second variable resistance layer 110.

A side wall protective layer 115 is formed on the side wall part of the variable resistance element 114 and the second interlayer insulating layer 105 so as to cover the side wall of the stacked structure 150. The side wall protective layer 115 comprises silicon nitride (20 to 50 nm in thickness), for example. In addition to the silicon nitride, the side wall protective layer 115 may comprise oxide, nitride, or oxynitride (for example, aluminum oxide or titanium oxide) which has an insulating property and an oxygen barrier property.

A third interlayer insulating layer 116 is formed on the second interlayer insulating layer 105, including the variable resistance element 114 and the side wall protective layer 115.

The second metal line 119 is formed within the third interlayer insulating layer 116, and above the stacked structure 150. The second metal line 119 is directly connected to the second electrode 111 which is comprised by the variable resistance element 114. Here, the second metal line 119 includes a metal part and a third barrier metal layer 117 composed of a conductive material. The third barrier metal layer 117 is formed around the outer circumference of the metal part.

Part of the lower surface of the second metal line 119 is below the upper surface (the upper surface of the second electrode 111) of the stacked structure 150. Here, the upper surface of the stacked structure 150 indicates a portion of the upper surface of the stacked structure 150, located at the uppermost position in the vertical direction (the direction perpendicular to the major surface of the semiconductor substrate). The upper surface of the stacked structure 150 may be an average vertical position of the upper surface of the stacked structure 150, or may be a portion of the upper surface of the stacked structure 150, located at the lowermost position in the vertical direction. The lower surface of the second metal line 119 is the lower surface of the third barrier metal layer 117 included in the second metal line 119. For example, part of the lower surface of the second metal line 119 is located under the upper surface of the second electrode 111 and above the lower surface of the second electrode 111 in FIG. 1.

Here, the variable resistance layer 113 comprises an oxygen-deficient transition metal oxide (for example, an oxygen-deficient tantalum oxide). Here, the oxygen-deficient transition metal oxide is an oxide when, for instance if a transition metal oxide having a composition represented by $MO_x$ in which M represents a transition metal and O represents oxygen, the composition x of oxygen O is less (typically exhibits a characteristic of a semiconductor) than in a stoichiometrically stable state (typically exhibits an insulator). When the transition metal is tantalum, a tantalum oxide having a composition that satisfies $0<x<2.5$ can be said to be an oxygen-deficient tantalum oxide because the stoichiometrically stable state of tantalum oxide is $Ta_2O_5$. By using the variable resistance layer 113 comprising the preceding oxygen-deficient tantalum oxide, a nonvolatile memory element which utilizes a resistance changing phenomenon and has stable rewriting characteristics can be implemented, the nonvolatile memory element having an electrical resistance value changeable reversibly in response to application of predetermined electrical pulses having different polarities. The details with respect to the basic configuration, manufacturing method, and operational characteristics of the above-described variable resistance element are disclosed in a related patent literature, PTL 1, for example.

It is to be noted that without being limited to the above-described oxygen-deficient tantalum oxide, the variable resistance layer may comprise other oxygen-deficient transition metal oxides such as hafnium oxide or zirconium oxide. When hafnium oxide is used, the hafnium oxide preferably has a composition of $HfO_x$ where $0.9 \leq x \leq 1.6$. Moreover, when zirconium oxide is used, the zirconium oxide preferably has a composition of $ZrO_x$ where $0.9 \leq x \leq 1.4$. By using a composition in such a preferable range, a stable resistance changing operation can be achieved.

The variable resistance layer 113 may be formed as a stacked structure including the first variable resistance layer 109 and the second variable resistance layer 110 as in the present embodiment, and in this case, the second variable resistance layer 110 is connected to the second electrode 111, and the second variable resistance layer 110 has an oxygen content atomic percentage that is higher than the oxygen content atomic percentage of the first variable resistance layer 109.

The details with respect to the manufacturing method, and operational characteristics of the variable resistance element when the variable resistance layer 113 has such a stacked structure of two layers are described in the related patent literature PTL 1, for example.

For example, when a tantalum oxide is used in the first variable resistance layer 109 and the second variable resistance layer 110, the first variable resistance layer 109 may have an oxygen content atomic percentage of 44.4 to 65.5 tm % (when the tantalum oxide is expressed as TaOx, $0.8 \leq x \leq 1.9$), and the second variable resistance layer 110 may have an oxygen content atomic percentage of 67.7 to 71.4 tm % (when the tantalum oxide is expressed as TaOy, $2.1 \leq y < 2.5$). By designing the second variable resistance layer 110, which is connected to the second electrode 111, to have an oxygen content atomic percentage that is higher than the oxygen content atomic percentage of the first variable resistance layer 109, a change in resistance in response to oxidation and reduction can occur more easily in the vicinity of the interface between the second variable resistance layer 110 and the second electrode 111. Thus, the variable resistance element 114 which can be driven by a low voltage and has stable variable resistance characteristics can be achieved.

It is to be noted that, a transition metal oxide layer has a stacked structure comprising tantalum oxide in the above-described example, however, a stacked structure comprising hafnium oxide or a stacked structure comprising zirconium oxide, for instance, may also be adopted.

When hafnium oxide is used in the stacked structure, a first hafnium oxide preferably has a composition of $HfO_x$ where $0.9 \le x \le 1.6$, a second hafnium oxide preferably has a composition of $HfO_y$ where $1.8 < y < 2.0$ and a film thickness of not less than 3 nm and not greater than 4 nm.

When zirconium oxide is used in the stacked structure, a first zirconium oxide preferably has a composition of $ZrO_x$ where $0.9 \le x \le 1.4$, a second zirconium oxide preferably has a composition of $ZrO_y$ where $1.9 < y < 2.0$ and a film thickness of not less than 1 nm and not greater than 5 nm.

When hafnium oxide is used, the first hafnium oxide layer is formed on a lower electrode through a so-called reactive sputtering method which is sputtering in argon gas and oxygen gas using a target of Hf. The second hafnium oxide layer can be formed by exposing the surface of the first hafnium oxide layer to a plasma of argon and oxygen gas after the formation of the first hafnium oxide layer. Similarly to the case of the above-mentioned tantalum oxide, the oxygen content atomic percentage of the first hafnium oxide layer can be easily adjusted by changing the flow rate of the oxygen gas with respect to the argon gas in the reactive sputtering.

It is to be noted that the above process can be performed at a room temperature without heating a substrate.

The thickness of the second hafnium oxide layer can be easily adjusted by changing the exposure time to the plasma of argon and oxygen gas. Stable variable resistance characteristics can be achieved with the first hafnium oxide layer having a composition of $HfO_x$ where $0.9 \le x \le 1.6$ and the second hafnium oxide layer having a composition of $HfO_y$ where $1.8 < y < 2.0$ and a film thickness of not less than 3 nm and not greater than 4 nm.

When zirconium oxide is used, the first zirconium oxide layer is formed on the lower electrode through a so-called reactive sputtering method which is sputtering in argon gas and oxygen gas using a target of Zr. The second zirconium oxide layer can be formed by exposing the surface of the first zirconium oxide layer to a plasma of argon and oxygen gas after the formation of the first zirconium oxide layer. Similarly to the case of the above-mentioned tantalum oxide, the oxygen content atomic percentage of the first zirconium oxide layer can be easily adjusted by changing the flow rate of the oxygen gas with respect to the argon gas in the reactive sputtering. It is to be noted that the above process can be performed at a room temperature without heating a substrate.

The thickness of the second zirconium oxide layer can be easily adjusted by changing the exposure time to the plasma of argon and oxygen gas. Stable variable resistance characteristics can be achieved with the first zirconium oxide layer having a composition of $ZrO_x$ where $0.9 \le x \le 1.4$ and the second zirconium oxide layer having a composition of $HfO_y$ where $1.9 < y < 2.0$ and a film thickness of not less than 1 nm and not greater than 5 nm.

It is preferable that a precious metal material such as iridium or platinum be used in the second electrode 111 included in the variable resistance element 114. The standard electrode potential of both platinum and iridium is approximately 1.2 eV. Generally, a standard electrode potential is an indicator of oxidizability. The higher the value is, the less oxidizable a material is, and the lower the value is, the more oxidizable a material is. The greater the difference between the standard electrode potentials of an electrode and the metal included in a variable resistance layer, more frequently an oxidation reaction occurs at the variable resistance layer, and thus the more easily a change in resistance occurs. As the difference becomes smaller, the more difficult it is for a change in resistance to occur in response to an oxidation reaction in the electrode. Accordingly, it is presumed that the high tendency of the variable resistance layer to oxidize at the interface between the electrode and the variable resistance layer will play a key role in a mechanism of the resistance changing phenomenon.

Because the standard electrode potential of tantalum is approximately −0.6 eV, which is lower than the standard electrode potential of platinum and iridium, oxidation and reduction of the oxygen-deficient tantalum oxide occur in the vicinity of the interface between the second electrode 111 comprising iridium or platinum and the variable resistance layer 113 (the second variable resistance layer 110). Accordingly, transfer of oxygen within the variable resistance layer 113 and between the variable resistance layer 113 and the second electrode 111 occurs, and thus a resistance changing phenomenon occurs.

Materials which have a higher standard electrode potential than tantalum include iridium, platinum, palladium, copper, and tungsten.

A stable memory characteristic can be achieved by using a material in the first electrode 108, the material being unlikely to undergo a resistance change and having a standard electrode potential lower than or equal to that of tantalum in order to stabilize the polarity which causes a resistance change. Specifically, materials including tantalum, tantalum nitride, titanium, titanium nitride, or titanium aluminum nitride may be used for the first electrode 108.

When a transition metal oxide such as an oxygen-deficient tantalum oxide is used as the material for the variable resistance layer 113, and a stacked structure including the first variable resistance layer 109 and the second variable resistance layer 110 is adopted, the initial resistance of the variable resistance element 114 is extremely high due to the presence of the second variable resistance layer 110 because the oxygen content atomic percentage of the second variable resistance layer 110 is set to be higher than the oxygen content atomic percentage of the first variable resistance layer 109. Therefore, in order to obtain variable resistance characteristics, a conductive path needs to be formed (broken down) in the variable resistance layer 113 by applying an electrical pulse (initial breakdown voltage) higher than a voltage normally used for a variable resistance to the variable resistance layer 113 in the initial state. Such a process is called an initial breakdown.

In the initial breakdown, the initial breakdown voltage is applied to the variable resistance layer 113 so as to cause current to flow through the second variable resistance layer 110 which is the high oxygen content layer (i.e., high resistance layer) of the variable resistance layer 113, so that the resistance value of the second variable resistance layer 110 is adjusted from an extremely high initial resistance value ($1 \times 10^6$ to $1 \times 10^8 \Omega$) to a low resistance value ($1 \times 10^2$ to $1 \times 10^4 \Omega$) which allows a change in resistance.

Here, it is presumed that the conductive path formed by the initial breakdown has a filament-like shape with a diameter of approximately 10 nm.

As a result of intensive study, the inventors have discovered that formation of a conducting path caused by an initial breakdown process heavily depends on the density of current which flows through the variable resistance layer.

Thus, when a variation occurs in the effective dimensions and area for current flow of the variable resistance element, a problem arises in that the initial breakdown voltage for forming a conducting path varies in a plurality of variable resistance elements.

That is to say, even when a uniform initial breakdown voltage is applied to variable resistance elements, the initial breakdown occurs in some variable resistance elements, but does not occur in the rest of the variable resistance elements because the density of current which flows through the variable resistance elements varies. That is to say, the yield is reduced because the rate of successful initial breakdown reduces.

In addition, characteristics such as retention (data holding) characteristics and endurance (data write endurance) characteristics are different for each nonvolatile memory element. Accordingly, an appropriate initial breakdown voltage cannot be set to all nonvolatile memory elements, and thus the yield for the nonvolatile memory elements is further reduced. Specifically, if the initial breakdown voltage is too high, the resistance value for indicating data "0" is lowered, and thus a resistance change to a high resistance state which indicates data "1" cannot be made. Accordingly, an endurance failure may occur where rewrite cannot be made. On the other hand, if the initial breakdown voltage is too low, the resistance value for indicating data "0" is increased. Accordingly, a retention failure (data cannot be held) may occur where the resistance changes to a high resistance state which indicates higher data "1" while data is held, so that data is rewritten.

As described above, due to a variation in the effective dimensions and area for current flow of the variable resistance elements, the density of current which flows through each element for causing an initial breakdown, i.e., an effective cross-sectional area through which current flows varies, thereby causing a failure. Consequently, the yield of the nonvolatile memory elements is reduced and the reliability thereof is lowered.

Possible causes of a variation in the effective dimensions and areas of the variable resistance elements 114 include the following. First, the side wall of the variable resistance layer 113 is oxidized primarily by an oxygen plasma or a material gas in the process of film formation of the third interlayer insulating layer. In addition, oxygen diffuses from the third interlayer insulating layer to the variable resistance layer 113 due to the subsequent heat treatment. This may cause the side wall of the variable resistance layer 113 to be oxidized. When an insulating oxide layer is formed around the variable resistance layer 113 due to such an undesired oxidation at the side wall of the variable resistance layer 113, the effective cross-sectional area of the variable resistance element 114, through which current flows at the time of an initial breakdown is reduced. Furthermore, the effective cross-sectional area of the variable resistance element 114 varies in the variable resistance elements 114 and the wafer surfaces.

Thus, in the present invention, the side wall protective layer 115 is formed to cover the side surface of the stacked structure 150 including the variable resistance layer 113 for the purpose of preventing oxidation at the side wall of the variable resistance layer 113, the oxidation being caused particularly by a process after the formation of the variable resistance element 114. Accordingly, the change in the effective dimensions and area for current flow of the variable resistance element 114 can be prevented. Consequently, a variation in the density of the current which flows through the variable resistance element 114 is reduced, and thus frequency of electrical failures decreases. Therefore, reduction in the yield of the nonvolatile memory element 10 can be prevented and the reliability can be increased.

It is desirable to use silicon nitride for the side wall protective layer 115.

The side wall protective layer 115 comprising silicon nitride serves as a barrier film against water and oxygens. Therefore, by covering the variable resistance element 114 with the side wall protective layer 115, oxidation at the side wall of the variable resistance layer 113 primarily due to a material gas and an oxygen plasma at the time of film formation of the third interlayer insulating layer 116 can be prevented, and diffusion of the oxygen contained in the third interlayer insulating layer 116 to the variable resistance layer 113 due to the subsequent heat treatment can be prevented. Thus, because the side wall of the variable resistance layer 113 can be prevented from being oxidized, the change in the effective cross-sectional area of the variable resistance layer 113 can be reduced, the effective cross-sectional area contributing to a resistance change.

Next, FIGS. 2 to 12 are each a cross-sectional view illustrating the method of manufacturing the nonvolatile memory element 10 according to Embodiment 1. The manufacturing method will be described with reference to FIGS. 2 to 12.

Figure 2:
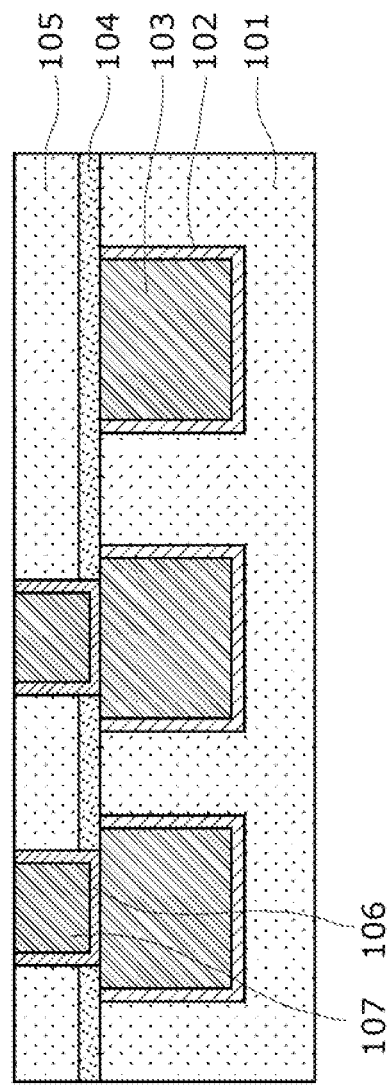
FIG. 2 is a cross-sectional view illustrating a method of manufacturing the nonvolatile memory element according to Embodiment 1 of the present invention.

First, as illustrated in FIG. 2, the first metal line 103 is formed on a semiconductor substrate on which transistors or the like are previously formed, and a plug 107 to be connected to the first metal line 103 is formed on the first metal line 103.

Specifically, the first interlayer insulating layer 101 comprising silicon oxide is formed on the semiconductor substrate using a method such as a plasma CVD. Subsequently, a line groove for embedding and forming the first metal line 103 in the first interlayer insulating layer 101 is formed by photo lithography and dry etching. A first barrier metal layer 102 (for example, a stacked structure including tantalum nitride (5 to 40 nm) and tantalum (5 to 40 nm)), and copper (50 to 300 nm) as a seed layer of wiring materials are deposited in the line groove using a method such as a sputtering method. Copper is further deposited on a copper seed layer using a method such as an electrolysis plating method, so that all line grooves are filled with copper which is line material. Subsequently, excessive copper on the surface out of the deposited copper is removed by CMP (Chemical Mechanical Polishing) method, while the surface of the first interlayer insulating layer 101 and the surface of the first metal line 103 are smoothed. In this manner, the first metal line 103 is formed.

Subsequently, silicon nitride is deposited at a depth of 30 to 200 nm by a method such as a plasma CVD, thereby forming the first liner layer 104 which covers the first interlayer insulating layer 101 and the first metal line 103.

Next, the second interlayer insulating layer 105 is further deposited on the first liner layer 104. If necessary, the surface having steps is smoothed by CMP method. Subsequently, a contact hole for embedding and forming the plug 107 to be connected to the first metal line 103 is formed at a predetermined position on the first metal line 103 by photo lithography and dry etching. Subsequently, the second barrier metal layer 106 comprising tantalum nitride (5 to 40 nm) and tantalum (5 to 40 nm), and copper (50 to 300 nm) as line material are deposited on the second interlayer insulating layer 105 having the formed contact hole by using a method such as a sputtering method. Copper is further deposited as a seed layer using a method such as an electrolysis plating method, so that the contact hole is filled with the second barrier metal layer 106 and copper, and thus the plug 107 is formed. Subsequently, excessive copper on the surface and the second barrier metal layer 106 are removed by CMP method, and the surface of the second interlayer insulating layer 105 and the surface of the plug 107 are smoothed.

Figure 3:
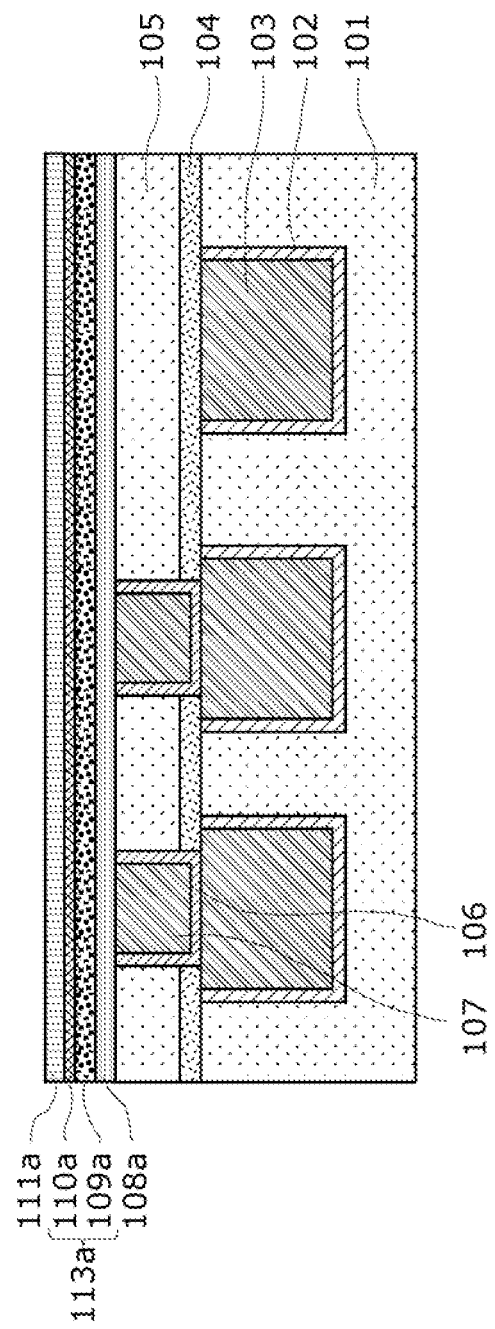
FIG. 3 is a cross-sectional view illustrating the method manufacturing of the nonvolatile memory element according to Embodiment 1 of the present invention.
Figure 4:
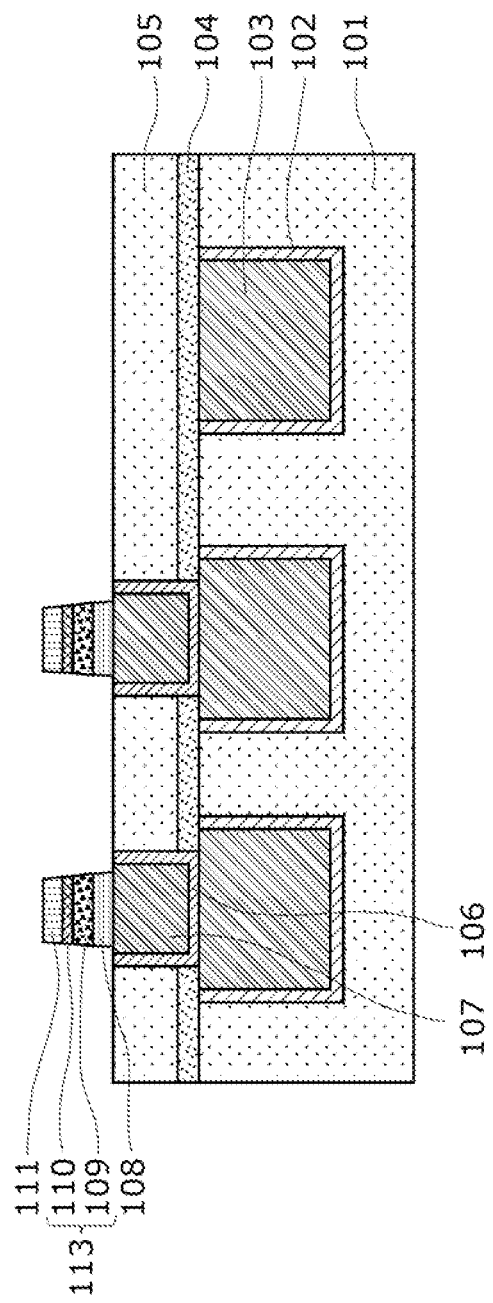
FIG. 4 is a cross-sectional view illustrating the method of manufacturing the nonvolatile memory element according to Embodiment 1 of the present invention.

Next, as illustrated in FIGS. 3 and 4, the stacked structure 150 including the variable resistance element 114 is formed on the upper surface of the plug 107.

First, as illustrated in FIG. 3, a first electrode layer 108a comprising tantalum nitride (with a film thickness of 30 nm), a variable resistance thin film 113a comprising an oxygen-deficient tantalum oxide (with a film thickness of 50 nm), and a second electrode layer 111a including iridium (with a film thickness of 50 nm) are deposited in this order on the second interlayer insulating layer 105 including the plug 107 so as to be horizontally stacked.

In the above step, any one (for example, titanium aluminum nitride) of tantalum nitride, titanium nitride and titanium aluminum nitride, each of which is a conductive film used as a hard mask for dry etching, may be deposited on the second electrode layer 111a containing a precious metal so as to be horizontally stacked (not illustrated).

Here, the first electrode layer, the second electrode layer, and the conductive hard mask (not illustrated) are formed using a method such as a sputtering method.

The variable resistance thin film 113a is formed using a so-called reactive sputtering method, by which sputtering is made in an argon and oxygen gas atmosphere using tantalum as a target. Here, the oxygen concentration in a layer is controlled to be in a range of 44.4 to 65.5 atom % by adjusting the flow rate of oxygen. Accordingly, the resistivity of the variable resistance thin film 113a can be adjusted to be in a range of 0.5 to 20 mΩ·cm (for example, by setting the oxygen concentration at 60 atm %, the variable resistance thin film 113a having a resistivity of approximately 2 mΩ·cm can be formed). Furthermore, oxidation treatment is performed on the variable resistance thin film 113a, and $Ta_2O_5$ layer with a thickness in a range of 2 to 12 nm may be formed as a second variable resistance thin film 110a on the uppermost surface layer of the above-described oxygen-deficient variable resistance thin film 113a (a first variable resistance thin film 109a), the second variable resistance thin film 110a having a higher oxygen content atomic percentage.

Next, as illustrated in FIG. 4, a horizontally layered stacked film is processed by photo lithography and dry etching so as to be connected to the plug 107, and the stacked structure 150 (the variable resistance element 114) as an independent dot shape (having a horizontal square cross section with the side length of 100 to 400 nm, e.g., 250 nm) is formed.

Figure 5:
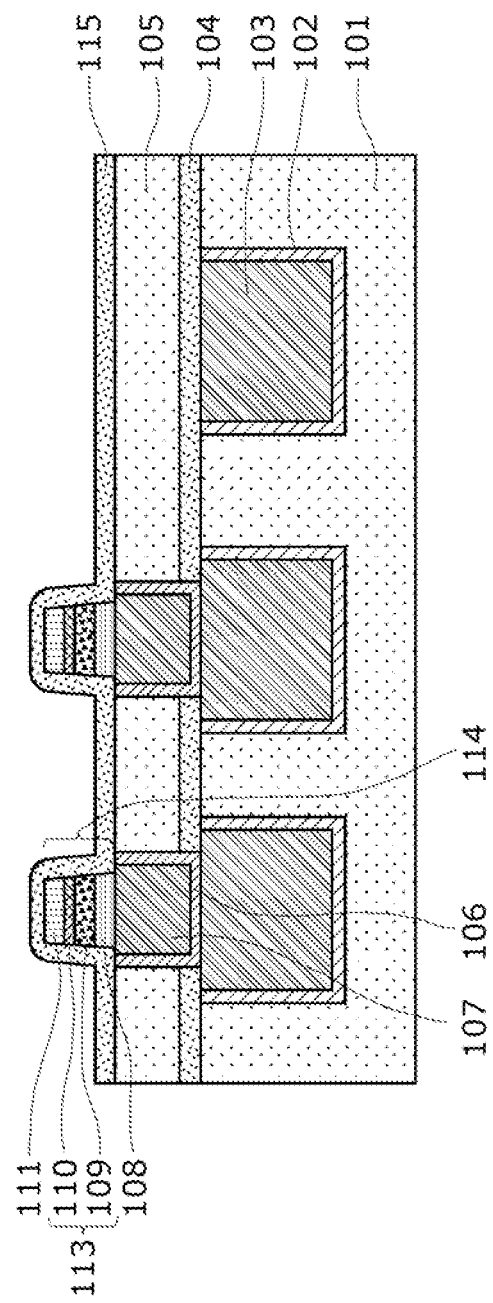
FIG. 5 is a cross-sectional view illustrating the method of manufacturing the nonvolatile memory element according to Embodiment 1 of the present invention.

Next, as illustrated in FIG. 5, the side wall protective layer 115 (with a film thickness of 50 nm) comprising silicon nitride is deposited on the second interlayer insulating layer 105 including the stacked structure 150 by using the plasma CVD.

Here, low pressure CVD is normally used as a method to form a film of silicon nitride having good step coverage capability for a projecting portion. Because the low pressure CVD allows the mean free path of reactive molecules to be increased, a thin film with good step coverage can be deposited. However, a film is formed at a high temperature of 650 to 800° C. in a film forming chamber by the low pressure CVD, thus cannot be used after lines are formed.

Thus, in the present embodiment, it is desirable to form the side wall protective layer 115 comprising silicon nitride using the plasma CVD which allows the formation of the layer at a temperature (250 to 400° C.) lower than that of the low pressure CVD.

Precious metals such as iridium or platinum are difficult to be formed by using a gas having a high vapor pressure. Thus, when precious metals such as iridium or platinum are used as the electrode material of the variable resistance element 114 as in the present embodiment, a reaction product in etching or a mixture of precious metals which are sputter-etched tends to adhere to the side of a photoresist while the stacked structure 150 in a dot shape is processed by dry etching because the mechanism of etching is primarily due to physical sputtering. Thus, after the photoresist is removed, fence-like etching residue is likely to be formed on the side surface and the upper surface of the stacked structure 150.

Then, in processing of the stacked structure 150 including precious metals, in order to prevent formation of residues (fence) after etching by eroding the side of a photoresist while etching a reaction product or a mixture of precious metals which adheres to the sides of a photoresist and the stacked structure 150 in an etching process, the cross-sectional shape of the stacked structure 150 is formed to be trapezoidal shape, in which the taper angle (the angle formed by an extension of the upper surface of stacked structure 150 and the side wall thereof) of the side wall is less than 90° (that is to say, a forward tapered shape, i.e., the width of the upper surface of the stacked structure 150 is smaller than the width of the lower surface thereof).

Thus, because the cross-sectional shape of the stacked structure 150 is a trapezoid with the taper angle of the side wall less than 90°, even when the plasma CVD, which has less step coverage capability than the low pressure CVD, is used, the side wall protective layer 115 comprising silicon nitride can be formed so as to conformally coat the side wall of the stacked structure 150 in a dot shape including a variable resistance element. Here, conformal refers to shape adaptable, and indicates that the side wall protective layer 115 having an approximately uniform thickness can be formed without a gap or break on the upper surface and the side surface of the stacked structure 150.

The side wall protective layer 115 comprising silicon nitride may be formed using the sputtering. In order to form silicon nitride film by sputtering, so-called reactive sputtering method is preferably used, which is performed in an atmosphere of a mixed gas of argon and nitrogen using, for example, polycrystalline silicon as a target.

Figure 6:
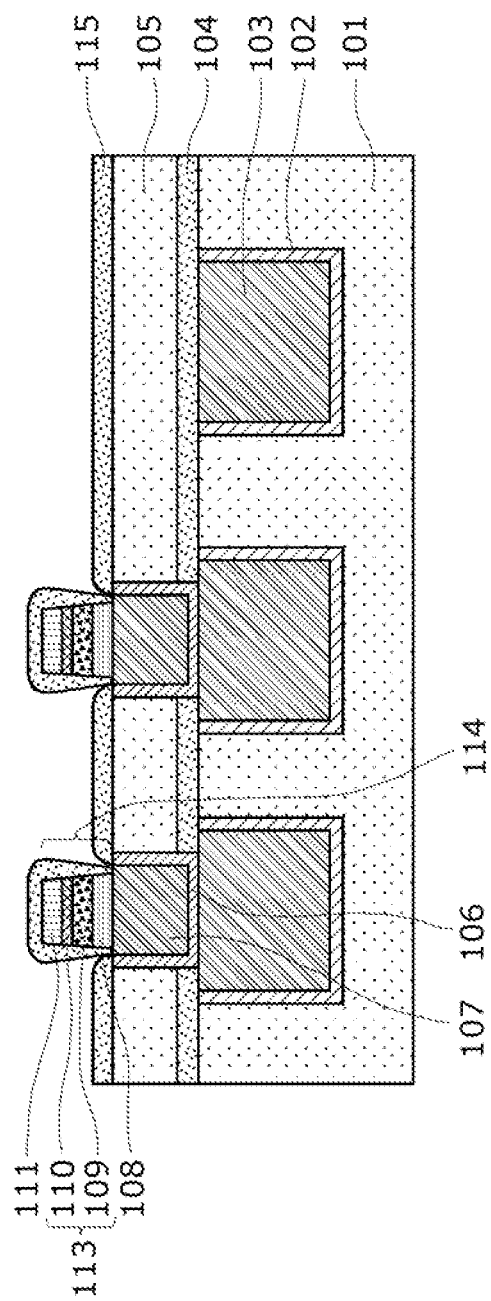
FIG. 6 is a cross-sectional view illustrating the method of manufacturing the nonvolatile memory element according to Embodiment 1 of the present invention.

Because the sputtering has less step coverage capability than the CVD in film formation, the film formed at the shoulder part of the upper end of the stacked structure 150 tends to be thick, i.e., so-called overhang shape is formed as illustrated in FIG. 6. However, in the present embodiment, when the side wall protective layer 115 is formed on the side wall portion of the stacked structure 150, particularly at least on the side wall of the variable resistance layer 113, the object of the present invention can be achieved, that is prevention of oxidation at the side wall of the variable resistance layer 113 and prevention of the formation of a leak path due to a contact between the side surface of the variable resistance layer 113 and the second metal line 119. Therefore, even when sputtering method having less step coverage capability is used, the effect that the side wall protective layer 115 with a sufficient quality is formed can be expected.

Subsequently, as illustrated in FIGS. 7 to 12, the second metal line 119 connected to the second electrode 111 is formed in the third interlayer insulating layer 116 and on the stacked structure 150 including the variable resistance element 114.

Figure 7:
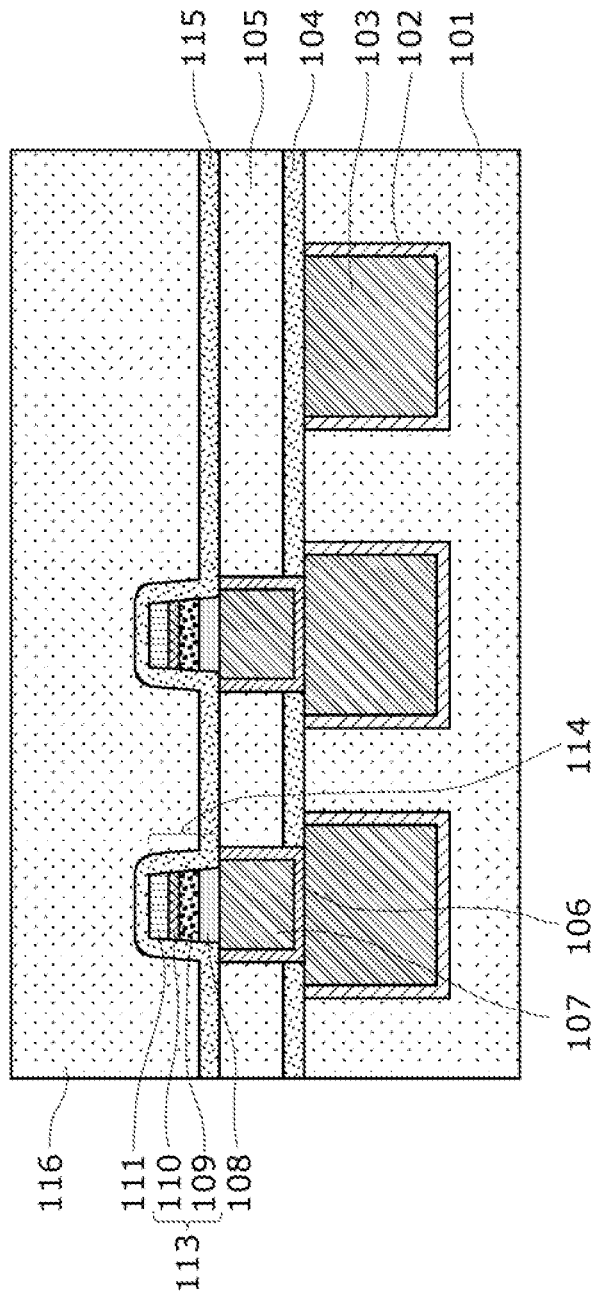
FIG. 7 is a cross-sectional view illustrating the method of manufacturing the nonvolatile memory element according to Embodiment 1 of the present invention.

First, as illustrated in FIG. 7, the third interlayer insulating layer 116 for embedding the second metal line is deposited using a method such as a plasma CVD, the third interlayer insulating layer 116 comprising silicon oxide.

Figure 8:
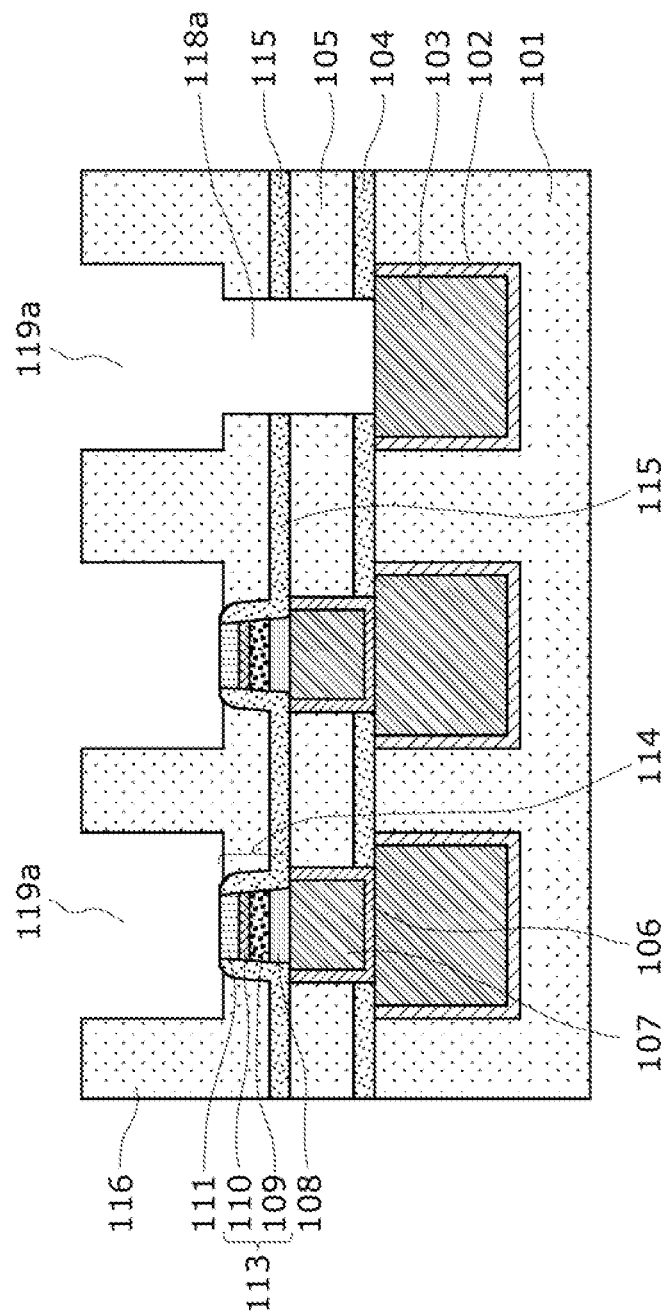
FIG. 8 is a cross-sectional view illustrating the method of manufacturing the nonvolatile memory element according to Embodiment 1 of the present invention.

Then, in the process illustrated in FIG. 8, a line groove 119a and a contact hole 118a are formed in the third interlayer insulating layer 116 by photo lithography and dry etching. The line groove 119a is formed such that the second electrode 111 is exposed, and is used to embed the second metal line 119. The contact hole 118a is formed at a predetermined portion on the first metal line 103, where the stacked structure 150 is not disposed. The contact hole 118a is used to form a drawer contact 118 to be connected to the first metal line 103.

Generally, the contact hole 118a is first formed by photo lithography and dry etching for the first time, and the line groove 119a is formed by photo lithography and dry etching for the second time, however, the line groove 119a may be formed first. Here, the side wall portion of the stacked structure 150 including the variable resistance element 114 is covered by the side wall protective layer 115 comprising silicon nitride. Thus, even when the line groove 119a is deeply formed, the variable resistance layer 113 can be prevented from being exposed to the inside of the line groove 119a because the side wall protective layer 115 is present on the side surface of the variable resistance layer 113.

Here, the details of the process of the formation of the line groove 119a are described.

First, the third interlayer insulating layer 116 comprising silicon oxide is etched, so that the side wall protective layer 115 comprising silicon nitride is exposed at the bottom the line groove 119a.

In the present embodiment, the silicon oxide is removed dry etching, and in the process of exposing the side wall protective layer 115, $C_5F_8$, $O_2$, and Ar are used as etching gases, for example, at a chamber pressure of 2.1 Pa with the flow rate of 17 sccm, 23 sccm, 500 sccm, respectively. In the above process, the etching rate of the silicon nitride is as low as 1/20 of the etching rate of the silicon oxide.

Figure 9:
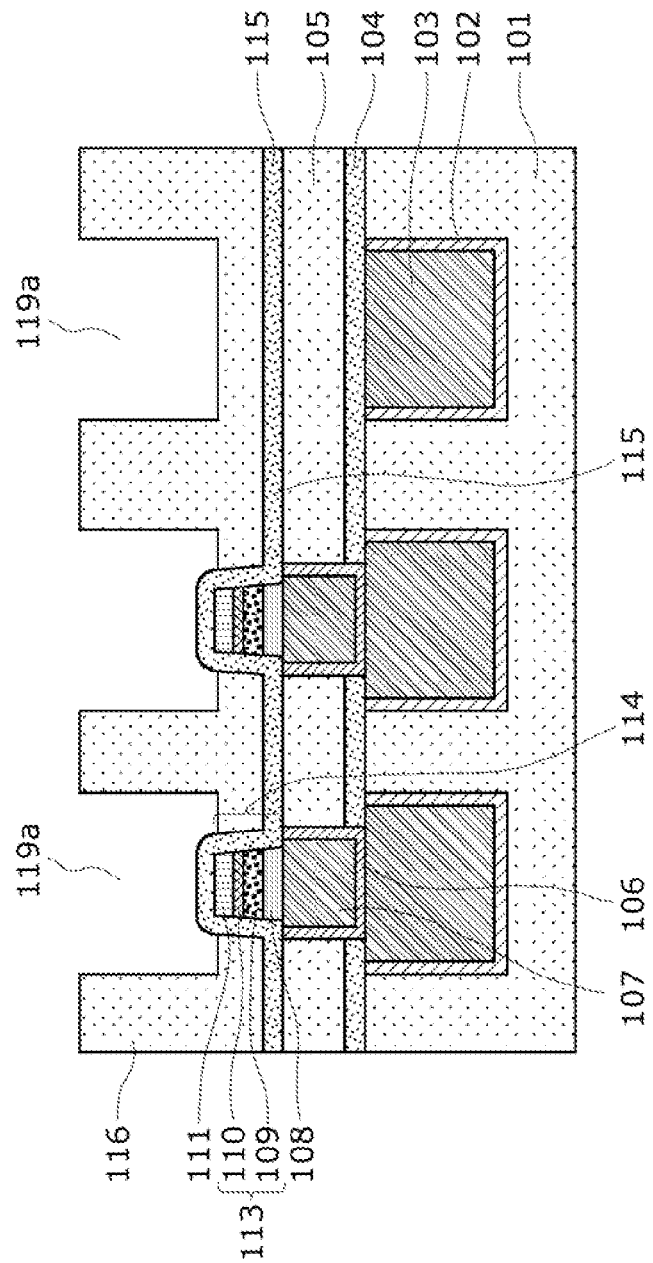
FIG. 9 is a cross-sectional view illustrating the method of manufacturing the nonvolatile memory element according to Embodiment 1 of the present invention.

Therefore, even when the line groove 119a is deeply formed as illustrated in FIG. 9, most of the side wall protective layer 115 remains without being etched on the upper surface and the side surface of the variable resistance layer 113, and thus the side surface of the variable resistance layer 113 can be prevented from being exposed to the inside of the line groove 119a.

Figure 10:
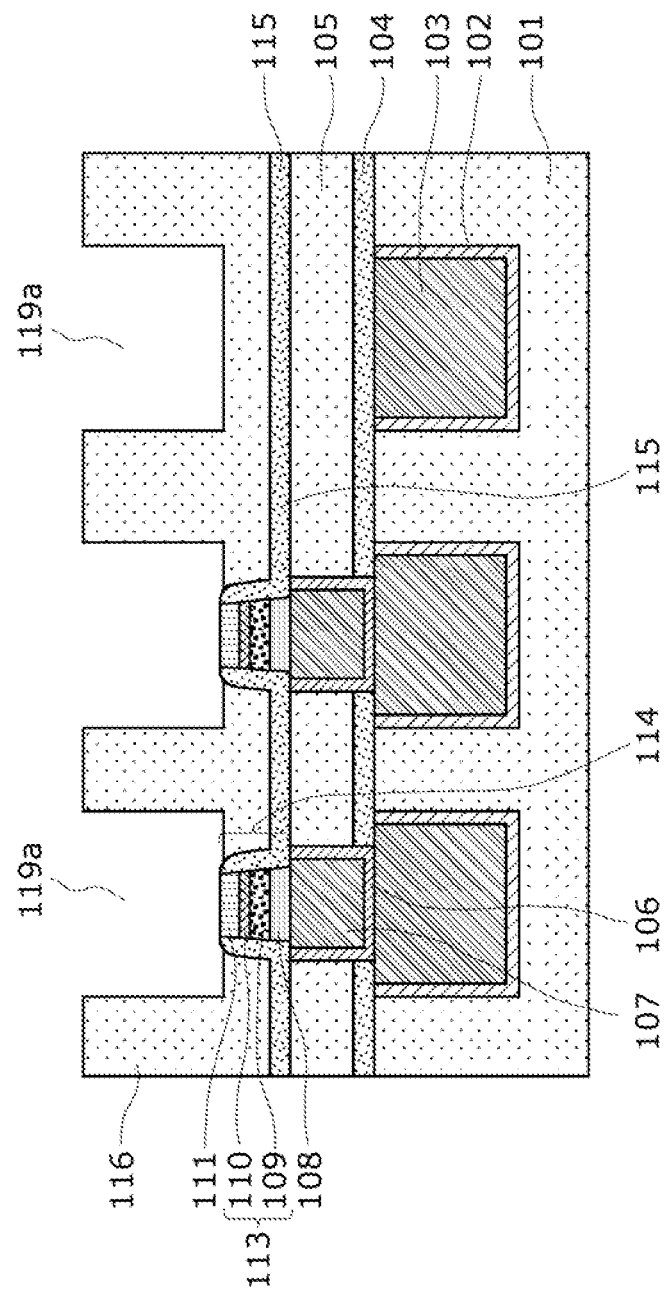
FIG. 10 is a cross-sectional view illustrating the method of manufacturing the nonvolatile memory element according to Embodiment 1 of the present invention.

Next, as illustrated in FIG. 10, the side wall protective layer 115 exposed to the bottom of the line groove 119a is removed by etching, and the line groove 119a is formed such that the second electrode 111 is exposed. In the above process, when $CHF_3$, $O_2$, and Ar are used as etching gases, for example, with the flow rate of 40 sccm, 15 sccm, 500 sccm, respectively, the etching rate of the silicon nitride this time is about twice the etching rate of the silicon oxide in contrast to the last etching.

Therefore, the side wall protective layer 115 on the second electrode 111 can be reliably removed, and the region of the bottom of the line groove 119a, that is in contact with the third interlayer insulating layer 116 is not deeply grooved.

Generally, in dry etching process using reactive ion etching (RIE), the etching rate in the ion incident direction (vertical direction) is absolutely higher than the etching rate in the non-incident direction (horizontal direction). Thus, when the side wall protective layer 115 on the second electrode 111 is intended to be removed, only the side wall protective layer 115 on the second electrode 111 is removed, and the side wall protective layer 115 located at the side wall portion of the variable resistance element 114 is not likely to be etched. Therefore, even when the line groove 119a is deeply grooved, the variable resistance layer 113 is not exposed to the inside of the line groove 119a.

Thus, the leak current can be prevented from flowing from the second metal line 119 to the variable resistance layer 113 not via the second electrode 111. When a path is formed, through which current flows from the second metal line 119 directly to the variable resistance layer 113, particularly, to the first variable resistance layer 109, a sufficient initial breakdown voltage is not applied to the second variable resistance layer 110. Thus, the yield is reduced because the rate of successful initial breakdown reduces.

When a conductive hard mask (not illustrated) is formed on the second electrode 111, etching is performed until the hard mask is exposed to the bottom of the line groove 119a, thereby forming the line groove 119a. The hard mask may be completely removed at the above timing. The parasitic resistance when the hard mask is completely removed is lower than the parasitic resistance when the hard mask remains, and thus a variation in the contact resistance can be reduced.

Figure 11:
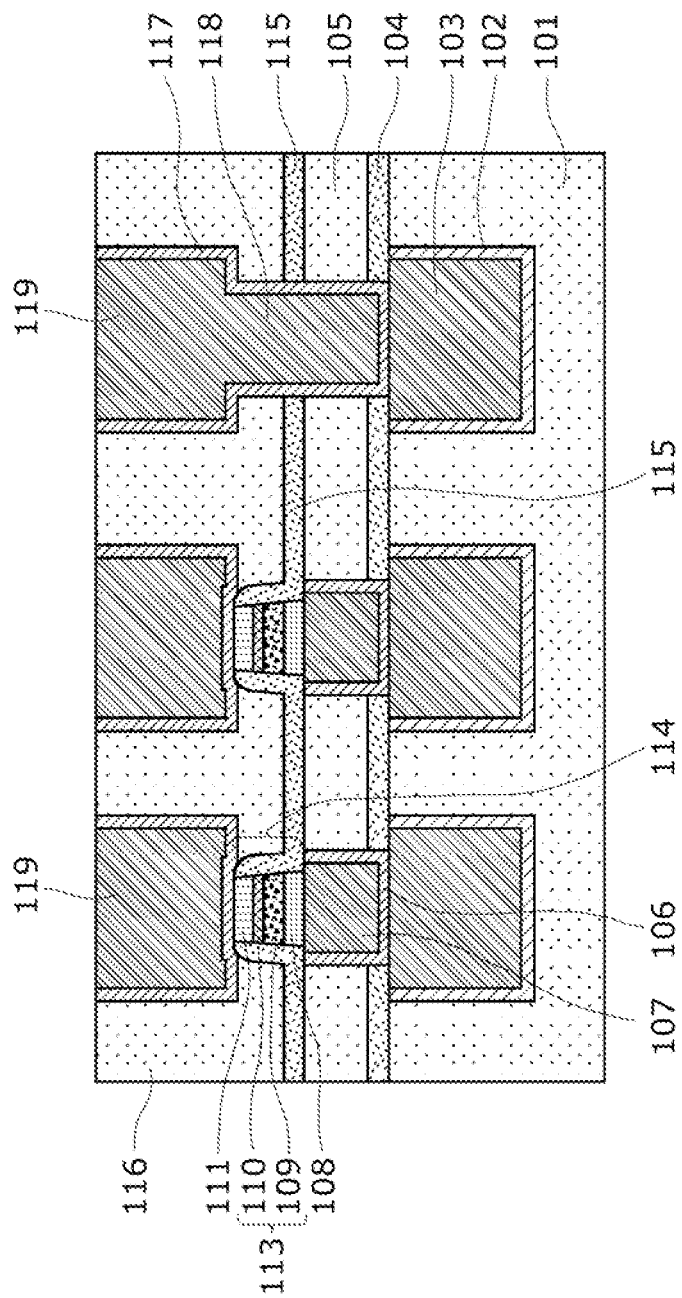
FIG. 11 is a cross-sectional view illustrating the method of manufacturing the nonvolatile memory element according to Embodiment 1 of the present invention.

Subsequently, as illustrated in FIG. 11, using the conditions similar to those in the process of embedding and forming the first metal line 103, the third barrier metal layer 117 (for example, a stacked structure including tantalum nitride (5 to 40 nm) and tantalum (5 to 40 nm)), and copper as a seed layer (50 to 300 nm) are deposited in the contact hole 118a and the line groove 119a using a method such as a sputtering method. Furthermore, copper is further deposited using the copper in the seed layer as a seed by a method such as an electrolysis plating method, so that the line groove 119a is completely filled with the wiring material of copper. Then, excessive copper on the surface and the third barrier metal layer 117 are removed by CMP method, and the surface of the third interlayer insulating layer 116 and the surface of the second metal line 119 are smoothed. Thus, the second metal line 119 is formed.

Figure 12:
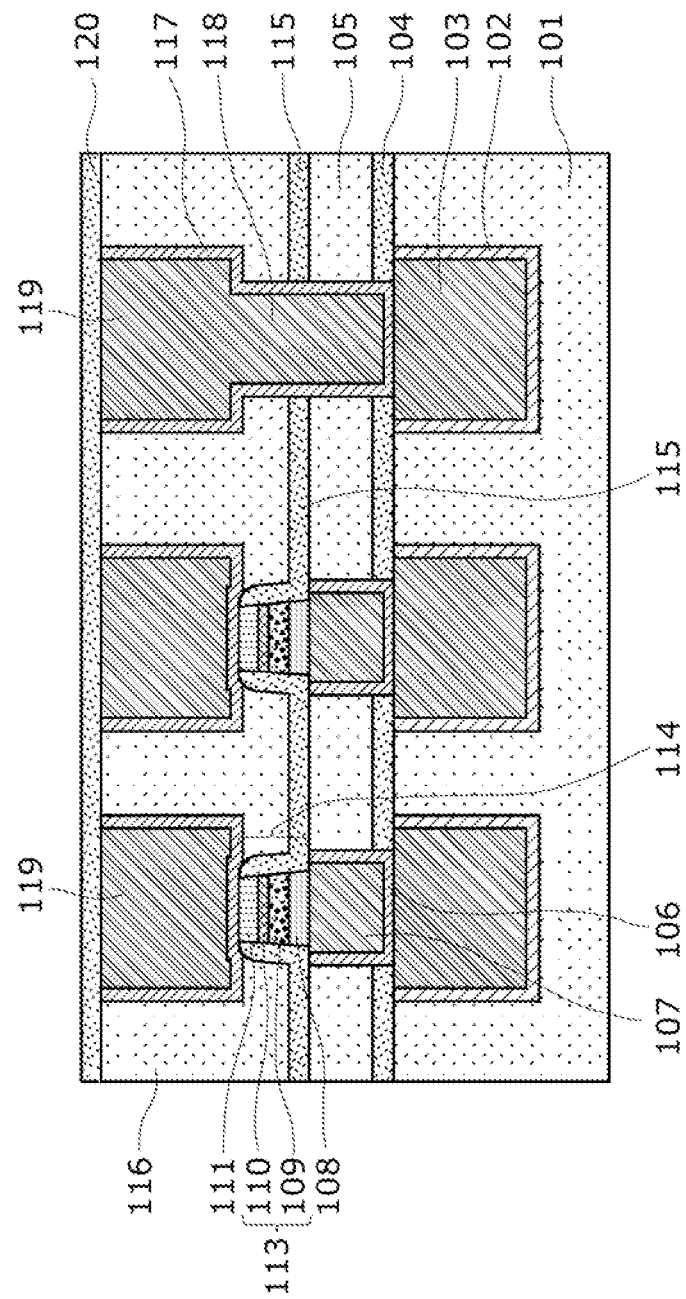
FIG. 12 is a cross-sectional view illustrating the method of manufacturing the nonvolatile memory element according to Embodiment 1 of the present invention.

Subsequently, as illustrated in FIG. 12, a silicon nitride layer is deposited with a thickness of 30 to 200 nm, e.g., 50 nm using a method such as the plasma CVD, so that a second liner layer 120 for covering the second metal line 119 is formed.

In the present embodiment, the second electrode 111 of the variable resistance element 114 is formed with iridium, however, the present invention is not limited to this. For example, the second electrode 111 may be formed with any one metal of platinum, copper, tungsten, iridium, and palladium, or a combination or an alloy thereof. By forming an electrode for the highly oxidized layer (the second variable resistance layer 110) of the variable resistance layer 113 with such an alloy, reduction and variation in the initial resistance can be reduced, and thus the initial breakdown voltage can be lowered.

Figure 13:
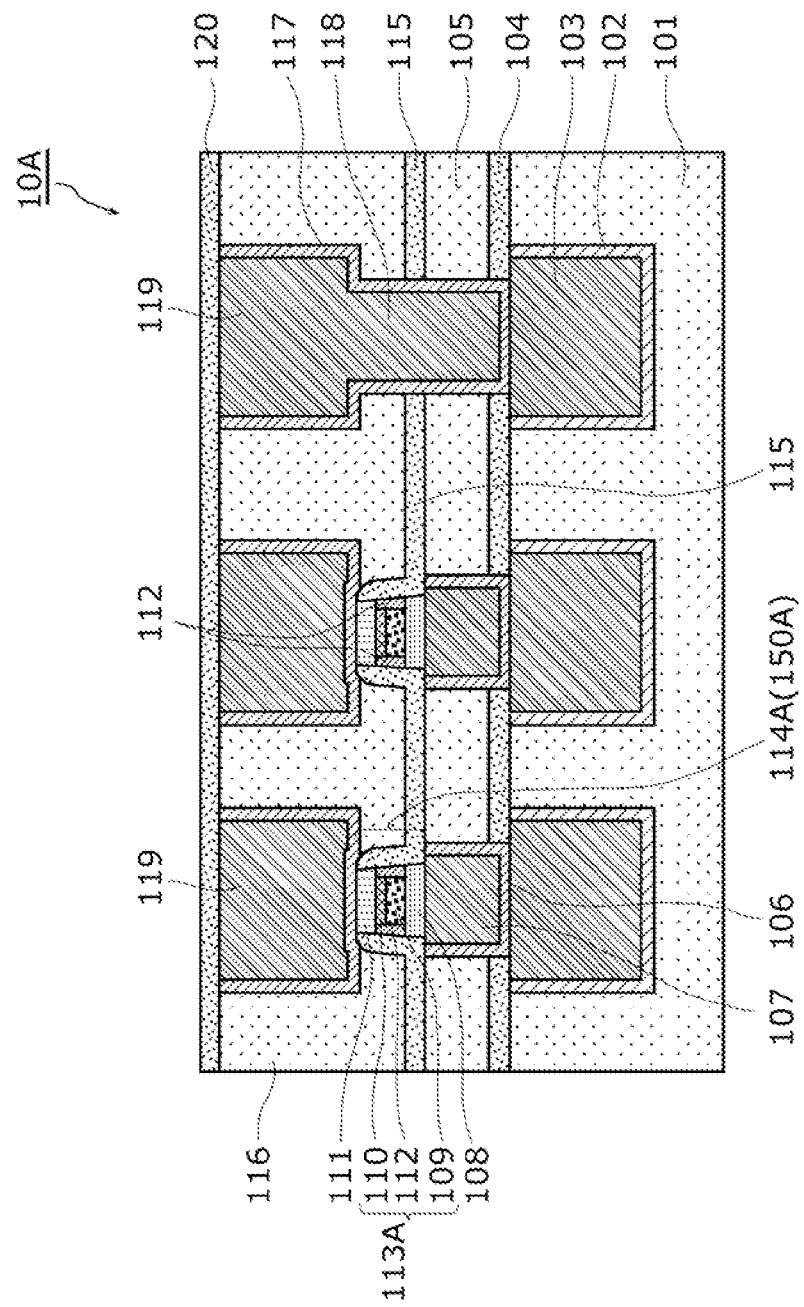
FIG. 13 is a cross-sectional view illustrating a modification example of the nonvolatile memory element according to Embodiment 1 of the present invention.

FIG. 13 is a cross-sectional view illustrating a nonvolatile memory element 10A which is a modification of the nonvolatile memory element 10 according to Embodiment 1 of the present invention. The nonvolatile memory element 10A differs from the nonvolatile memory element 10 in that the configuration of a variable resistance layer 113A included in a variable resistance element 114A (stacked structure 150A) is different from the configuration of the variable resistance layer 113. In addition to the configuration of the variable resistance layer 113, the variable resistance layer 113A further includes a resistance layer 112 which is formed at the side wall portions of the first variable resistance layer 109 and the second variable resistance layer 110.

The resistance layer 112 comprises an insulating transition metal oxide ($Ta_2O_5$ which is essentially expressed as stoichiometric ratio in the present embodiment) having a higher oxygen content atomic percentage than that of the first variable resistance layer 109.

With the above-described configuration, the density of current which flows at the time of an initial breakdown is determined based on the cross-sectional area of the first variable resistance layer 109 and the second variable resistance layer 110 which are surrounded by the insulating resistance layer 112. Thus, the effective cross-sectional area, through which current flows at the time of the initial breakdown of the variable resistance element 114A is reduced. Consequently, the density of current which flows through the variable resistance element 114A increases, and thus the initial breakdown voltage can be reduced. In addition, a variation in the density of the current which flows through the variable resistance element 114A is reduced, and thus frequency of electrical failures decreases. Consequently, reduction in the yield of the nonvolatile memory element 10A can be prevented and the reliability can be increased.

Here, resistance layer 112 can be formed as follows. In the process illustrated in FIG. 4, after the variable resistance element 114 is formed as the stacked structure 150 in a dot shape, the side surface of the stacked structure 150 is oxidized. Accordingly, the resistance layer 112 is formed around the periphery of the side surface of the variable resistance region (the first variable resistance layer 109 and the second variable resistance layer 110) of the variable resistance layer 113.

In this manner, by oxidizing the side surface of the variable resistance layer 113, the resistance layer 112, which is an insulating region, is formed around the periphery of the first variable resistance layer 109 and the second variable resistance layer 110. Thus, the effective horizontal cross-sectional area of the variable resistance element 114A can be easily reduced.

The RTA method or the plasma oxidation method is preferably used as a method to form the resistance layer 112 by oxidizing the side wall portions of the first variable resistance layer 109 and the second variable resistance layer 110, the resistance layer 112 comprising $Ta_2O_5$ which has a high insulating property and an oxygen concentration of 67.7 to 71.4 atm % which is close to the stoichiometric ratio. By using the RTA method or the plasma oxidation method, controllability over the film thickness of the resistance layer 112 in the horizontal direction with respect to the stacked structure 150A, i.e., controllability over reduced amount in the effective size of the variable resistance element 114A can be improved.

In addition, by covering the side wall of the variable resistance element 114A (stacked structure 150A) with the side wall protective layer 115 after the formation of the resistance layer 112, it is possible to prevent a change in the film thickness of the resistance layer 112, which may be caused by the film formation process and the heat treatment process for the interlayer insulating layer after the formation of the variable resistance element 114A. Therefore, a variation in the effective horizontal cross-sectional area, which contributes to a resistance change of the variable resistance element 114A, can be reduced.

Embodiment 2

In Embodiment 2 of the present invention, a case will be described in which the present invention is applied to a nonvolatile memory device 20 including a diode element.

Figure 14:
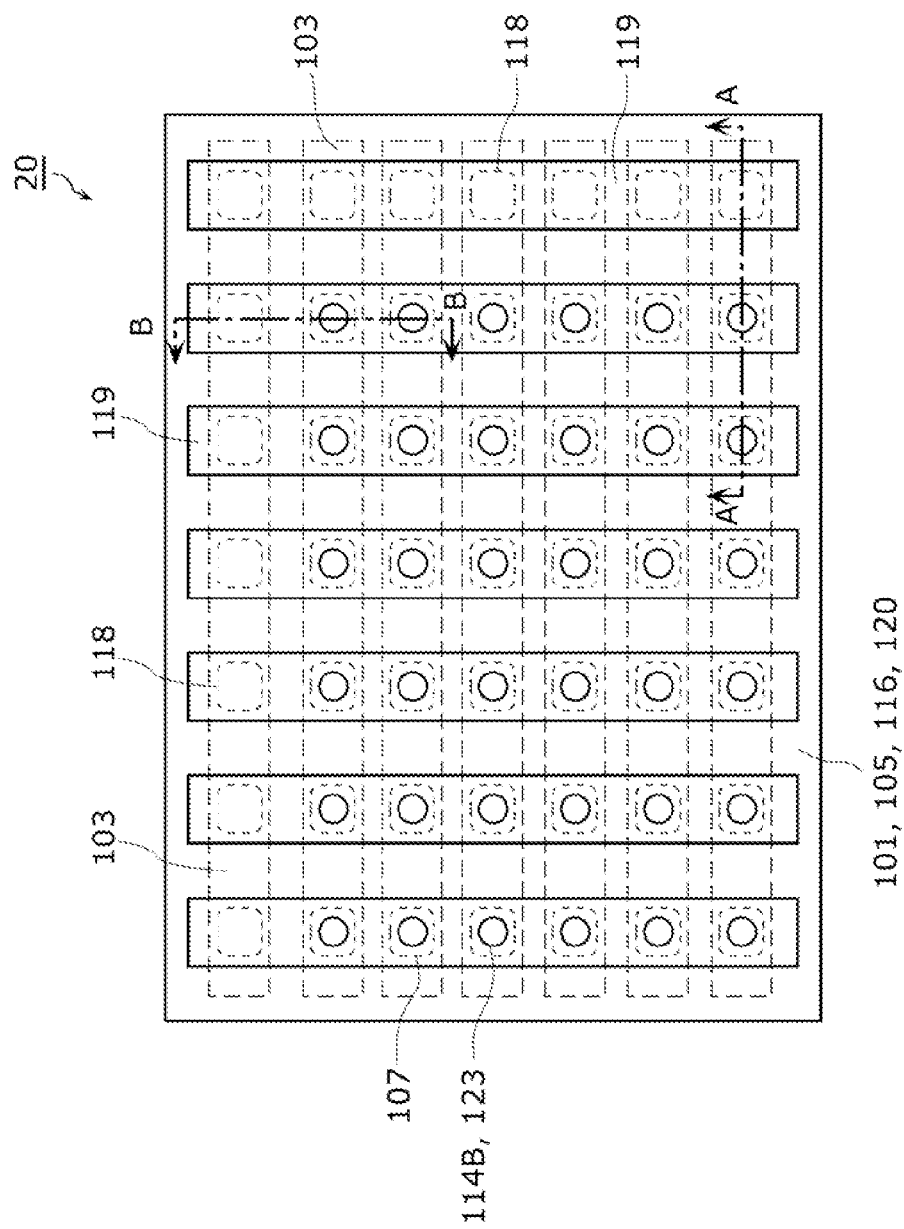
FIG. 14 is a plan view illustrating a configuration example of a nonvolatile memory device according to Embodiment 2 of the present invention.
Figure 15:
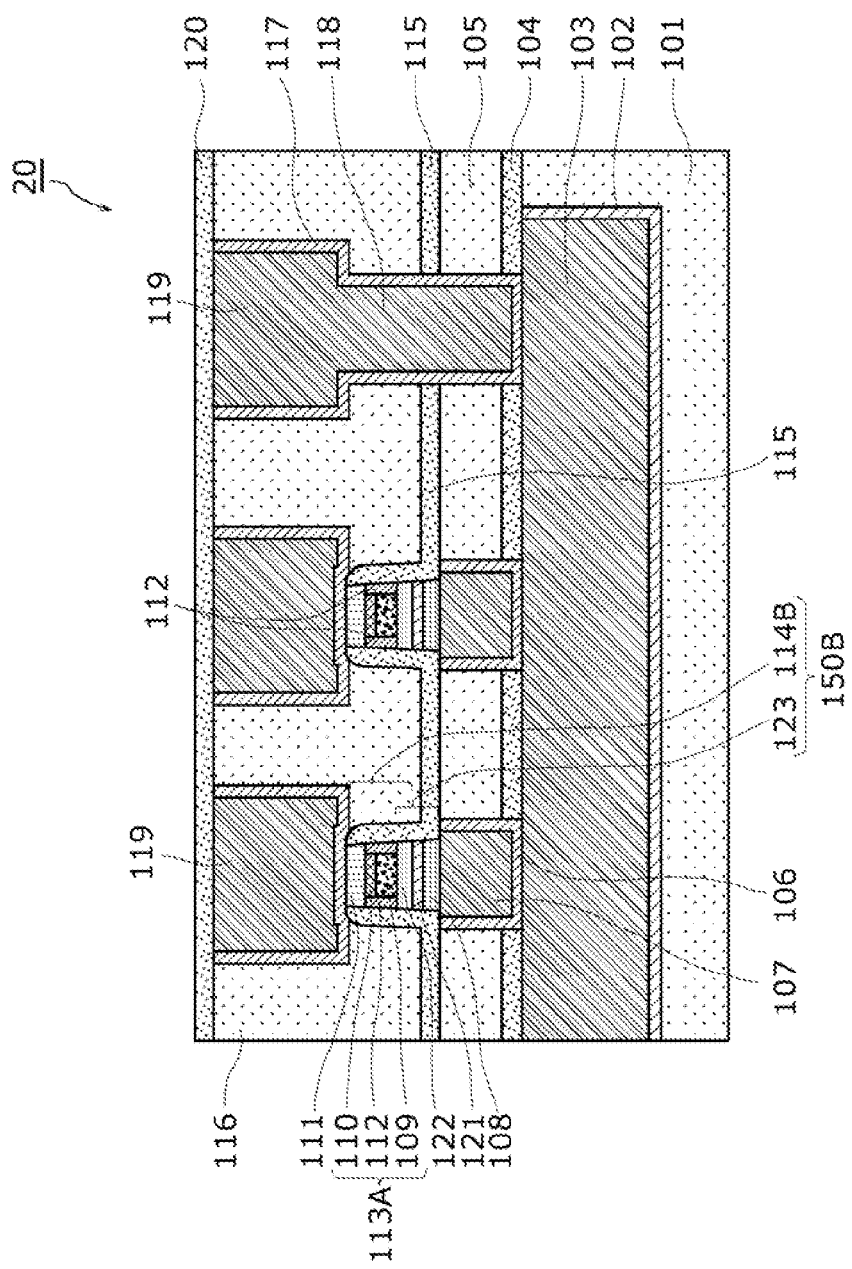
FIG. 15 is a cross-sectional view illustrating a configuration example of the nonvolatile memory device according to Embodiment 2 of the present invention.
Figure 16:
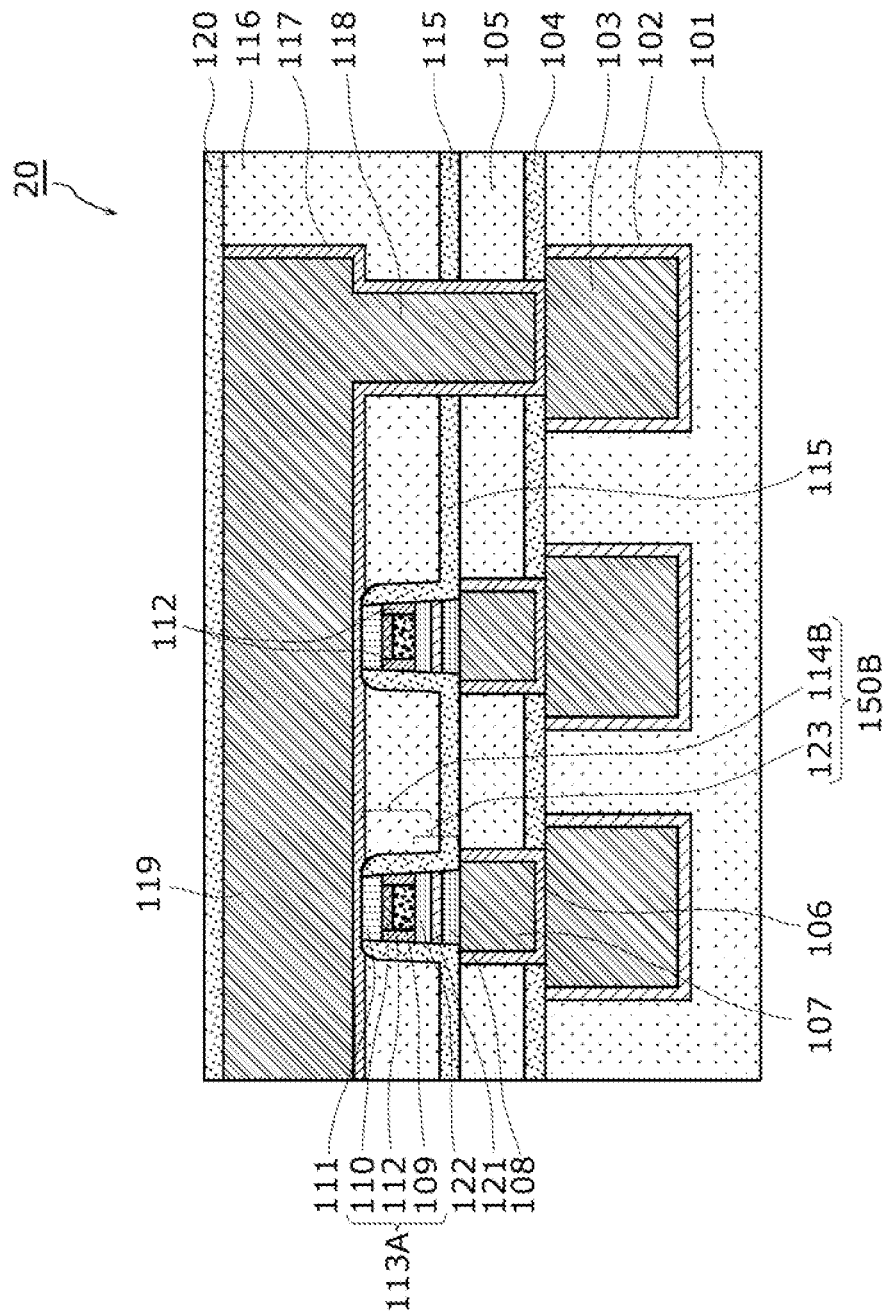
FIG. 16 is a cross-sectional view illustrating a configuration example of the nonvolatile memory device according to Embodiment 2 of the present invention.

FIG. 14 is a plan view illustrating a configuration example of the nonvolatile memory device 20 according to Embodiment 2 of the present invention. FIGS. 15 and 16 are each a cross-sectional view illustrating a configuration example of the nonvolatile memory device according to Embodiment 2 of the present invention. FIG. 15 corresponds to a cross-section taken along a plane A-A in FIG. 14 as viewed from the direction of an arrow at A, and FIG. 16 corresponds to a cross-section taken along a plane B-B in FIG. 14 as viewed from the direction of an arrow at B.

As illustrated in the plan view of FIG. 14, the nonvolatile memory device 20 according to Embodiment 2 of the present invention includes a plurality of parallel first metal lines 103 formed in a stripe pattern, and a plurality of parallel second metal lines 119 formed in a stripe pattern. A stacked structure 150B including the plug 107, a variable resistance element 114B, and a diode element 123 is formed at each of the cross-points of the plurality of first metal lines 103 and the plurality of second metal lines 119. In the above-described Embodiment 1, a variable resistance element is referred to as a stacked structure, however, in Embodiment 2, the stacked structure is defined to include a variable resistance element and a diode element.

In FIG. 14, the first metal lines 103 and the second metal lines 119 are perpendicular to each other, however, the two sets of lines are not necessarily perpendicular to each other, and the first metal lines 103 and the second metal lines 119 may be arranged to cross each other. The same condition as the above applies to Embodiment 3 which will be described below.

Here, a diode element (current control element) has a threshold voltage in each of a positive applied voltage region and a negative applied voltage region, and has nonlinear characteristics such that when the absolute value of an applied voltage is greater than the absolute value of a corresponding threshold voltage, the diode element is set in a conductive (ON) state, and when the value of an applied voltage is in an region other than the above region (the absolute value of an applied voltage is smaller than the absolute value of a corresponding threshold voltage), the diode element is set in a shutdown (OFF) state.

The same components as in FIG. 13 are labeled with the same reference symbols, and hereinafter, differences between Embodiment 1 and Embodiment 2 will be mainly described. Hereinafter, the configuration which is obtained by adding the diode element 123 to the configuration illustrated in FIG. 13 will be described. However, the configuration may be obtained by adding the diode element 123 to the configuration illustrated in FIG. 1.

The nonvolatile memory device 20 according to Embodiment 2 illustrated in FIGS. 15 and 16 differs from the nonvolatile memory element 10 illustrated in FIG. 13 in that the configuration of the stacked structure 150B is different from that of the stacked structure 150A. Specifically, the stacked structure 150B includes the variable resistance element 114B and the diode element 123. The stacked structure 150B includes the first electrode 108, a semiconductor layer 121, an intermediate electrode 122, the variable resistance layer 113A, and the second electrode 111 in this stacking order.

The semiconductor layer 121 is formed between the first electrode 108 and the variable resistance layer 113A, and is connected to the first electrode 108. The intermediate electrode 122 is interposed between the semiconductor layer 121 and the variable resistance layer 113A.

Here, the diode element 123 comprises the first electrode 108, the semiconductor layer 121, and the intermediate electrode 122. The variable resistance element 114B comprises the intermediate electrode 122, the variable resistance layer 113A, and the second electrode 111.

The side wall protective layer 115 comprising silicon nitride is formed around the side wall portion of the stacked structure 150B and on the second interlayer insulating layer 105.

Here, nitrogen-deficient silicon nitride is used for the semiconductor layer 121 comprised by the diode element 123, and tantalum nitride is used for the first electrode 108 and the intermediate electrode 122.

The nitrogen-deficient silicon nitride is silicon nitride which is expressed as $SiN_z$ (0<z) with a composition z of nitrogen N less than the composition z in a stoichiometrically stable state. Because $Si_3N_4$ is in a stoichiometrically stable state, SiNz with 0<z<1.33 can be referred to as nitrogen-deficient silicon nitride. When tantalum nitride is used as an electrode material, SiNz exhibits semiconductor characteristics in a range of 0<z≤0.85. Therefore, by using such a material, an MSM (Metal-Semiconductor-Metal) diode which can turn on and off a sufficient voltage and current for a resistance change can be formed.

For the formation of nitrogen-deficient silicon nitride, so-called reactive sputtering method is used, which is performed in an atmosphere of a mixed gas of argon and nitrogen using, for example, polycrystalline silicon as a target. Typical film formation conditions as follows: the pressure is from 0.08 to 2 Pa, the substrate temperature is from 20 to 300°, the flow rate of nitrogen gas (ratio of the flow amount of nitrogen with respect to the total flow amount of argon and nitrogen) is from 0 to 40%, and DC power is from 100 to 1300 W. In addition, a film forming time is adjusted so that the thickness of nitrogen-deficient silicon nitride is in a range of 5 to 20 nm.

Here, the work function of tantalum nitride is 4.6 eV, which is sufficiently higher than the electron affinity of silicon 3.8 eV, and thus a Schottky barrier is formed at the interface between the first electrode 108 and the semiconductor layer 121 and the interface between the semiconductor layer 121 and the intermediate electrode 122.

At the time of a resistance change of the variable resistance element 114B, current having an extremely high current density of 10 $kA/cm^2$ or greater flows. A high melting point metal such as tantalum and nitride of the metal have an excellent heat resistance, and thus exhibit stable characteristics even when current having an extremely high current density is applied thereto. Because of the above reason, preferable electrode material for an MSM diode includes tantalum, tantalum nitride, titanium, titanium nitride, tungsten, and tungsten nitride.

The intermediate electrode 122 serves not only as the upper electrode of the diode element 123, but also as the lower electrode of the variable resistance element 114B. Thus, it is desirable to use tantalum, tantalum nitride, titanium, or titanium nitride for the intermediate electrode 122.

Similarly to the above-described Embodiment 1, in the present embodiment, the diode element 123 is formed at the lower side of the stacked structure having a cross section of a trapezoid with the taper angle less than 90°. Therefore, the cross-sectional area of the diode element 123 can be made larger than the cross-sectional area of the variable resistance element 114B. Consequently, the allowable current of the diode element 123 can be increased, and thus diode destruction at the time of a resistance change of the variable resistance element 114B can be reduced.

Similarly to the variable resistance layer 113 comprised by the variable resistance element 114B, the semiconductor layer 121 comprised by the diode element 123 has a problem in that oxidation at the side wall increases due to the film formation process and the heat treatment process for the interlayer insulating layer after the formation of the stacked structure 150B. Thus, the effective cross-sectional area of the diode element 123 is reduced, and thus the current capacity decreases.

To cope with this problem, the side wall of the stacked structure 150B including the diode element 123 is covered by the side wall protective layer 115, and thus the semiconductor layer 121 can be prevented from being oxidized at the side wall. Consequently, decrease in the cross-sectional area of the diode element 123 can be prevented, and thus reduction in the capacity of the diode element 123 can be prevented.

In this manner, by using the configuration with a combination of the variable resistance element 114B and the diode element 123, an occurrence of write disturb between adjacent memory cells can be reliably prevented. Consequently, it is possible to achieve a highly integrated variable resistance nonvolatile memory element having a large capacity without disposing a switching device such as a transistor.

FIG. 17 to FIG. 20 are each a cross-sectional view illustrating the process of forming the stacked structure 150B in the method of manufacturing the nonvolatile memory device 20 in the present Embodiment 2. The manufacturing method will be described with reference to FIGS. 17 to 20.

Figure 17:
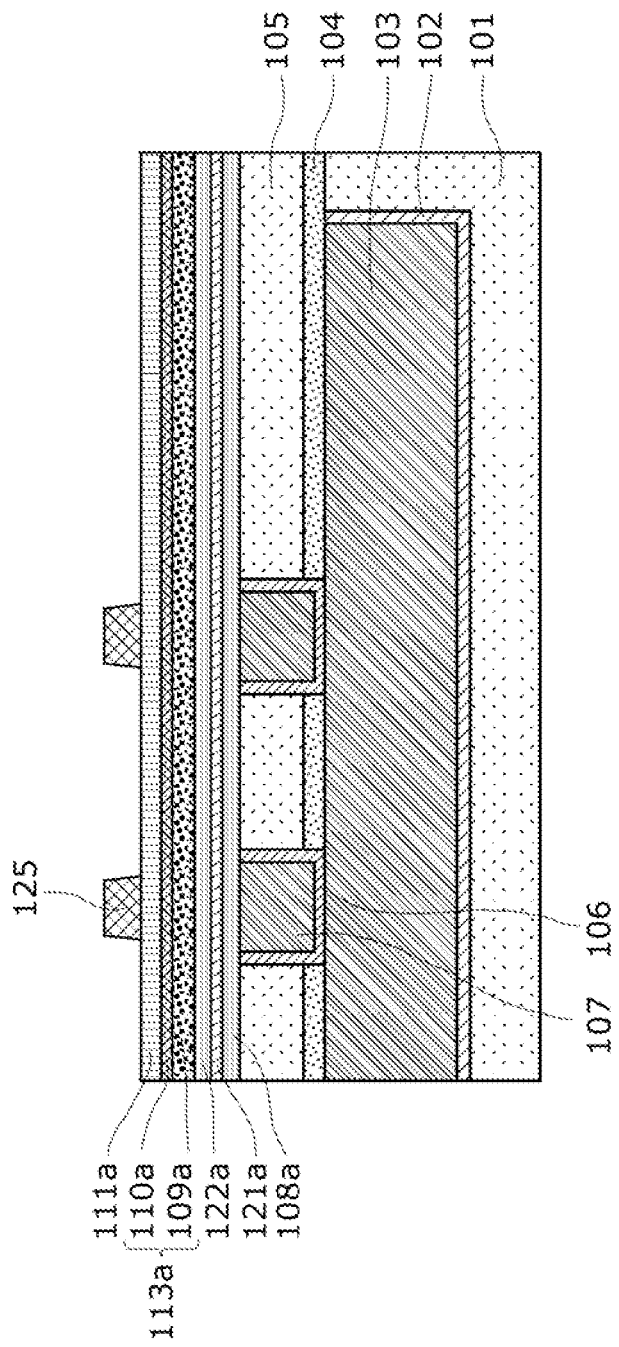
FIG. 17 is a cross-sectional view illustrating a method of manufacturing the nonvolatile memory device according to Embodiment 2 of the present invention.

First, similarly to the method of manufacturing the nonvolatile memory element 10 in Embodiment 1, the first metal line 103 and the plug 107 are formed as illustrated in FIG. 17.

Then the first electrode layer 108a, a semiconductor thin film 121a, an intermediate electrode layer 122a, the variable resistance thin film 113a, and the second electrode layer 111a which are included in the variable resistance element 114B and the diode element 123 are stacked on the second interlayer insulating layer 105 including the plug 107.

Subsequently, by using a normal exposure process and an etching process as needed, a mask 125 in a dot shape for fabricating a stacked structure into a dot shape is formed at a corresponding position of each plug 107. A photoresist mask or a hard mask comprising aluminum nitride titanium is preferably used as the mask 125.

Figure 18:
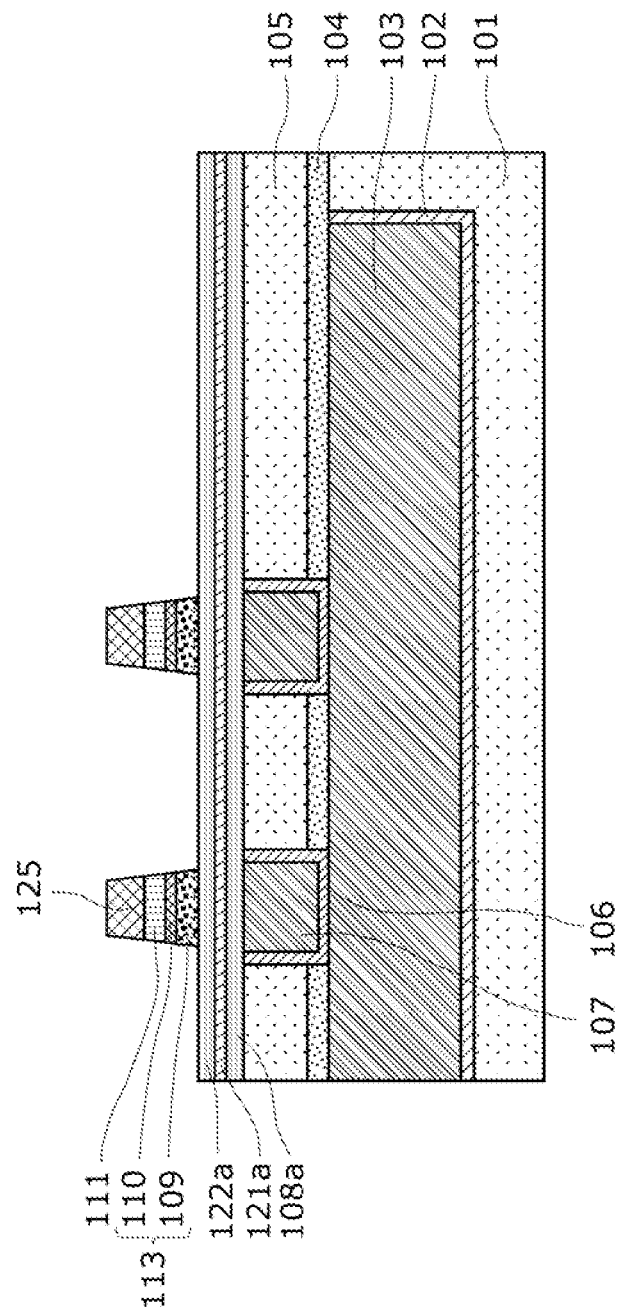
FIG. 18 is a cross-sectional view illustrating the method of manufacturing the nonvolatile memory device according to Embodiment 2 of the present invention.

Next, as illustrated in FIG. 18, the second electrode layer 111a and the variable resistance thin film 113a are fabricated into a dot shape similar to the mask 125 by dry etching.

Figure 19:
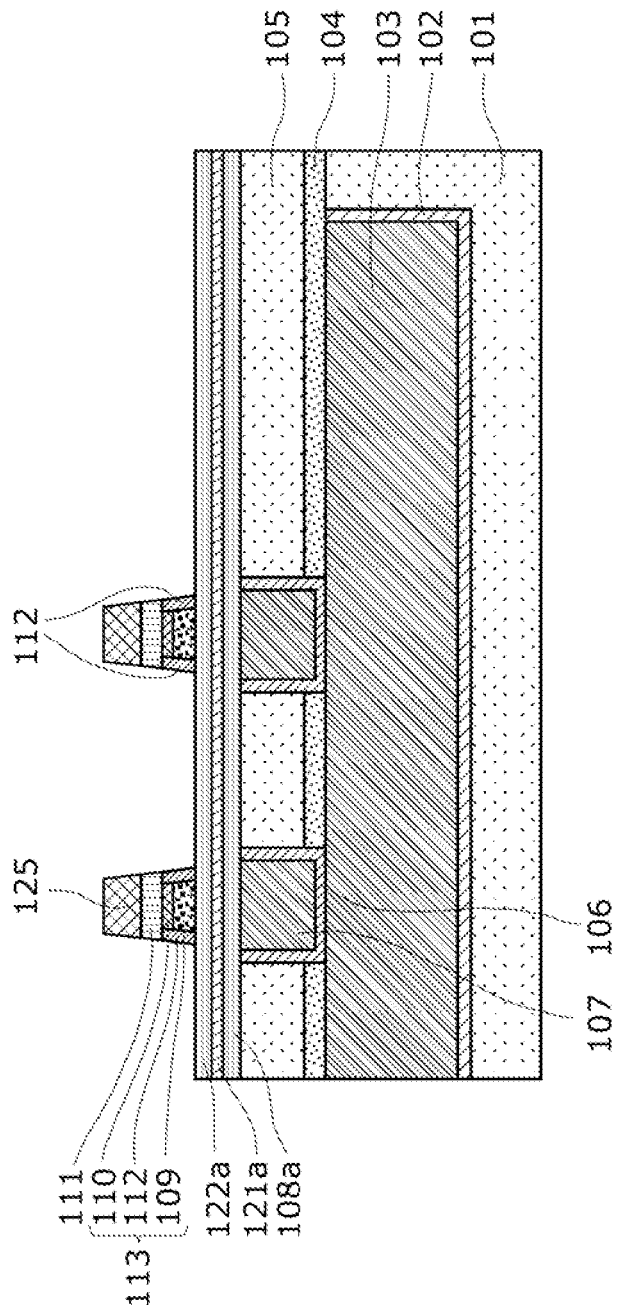
FIG. 19 is a cross-sectional view illustrating the method of manufacturing the nonvolatile memory device according to Embodiment 2 of the present invention.

Next, as illustrated in FIG. 19, the insulating resistance layer 112 is formed on the side surface of the first variable resistance layer 109 and the second variable resistance layer 110 using the plasma oxidation method. Accordingly, the effective cross-sectional area of the variable resistance element 114B, through which current flows at the time of an initial breakdown is reduced. In the above process, the semiconductor thin film 121a is covered by the intermediate electrode layer 122a, and thus does not undergo the plasma oxidation process for reducing the cross-sectional area of the variable resistance element 114B.

Figure 20:
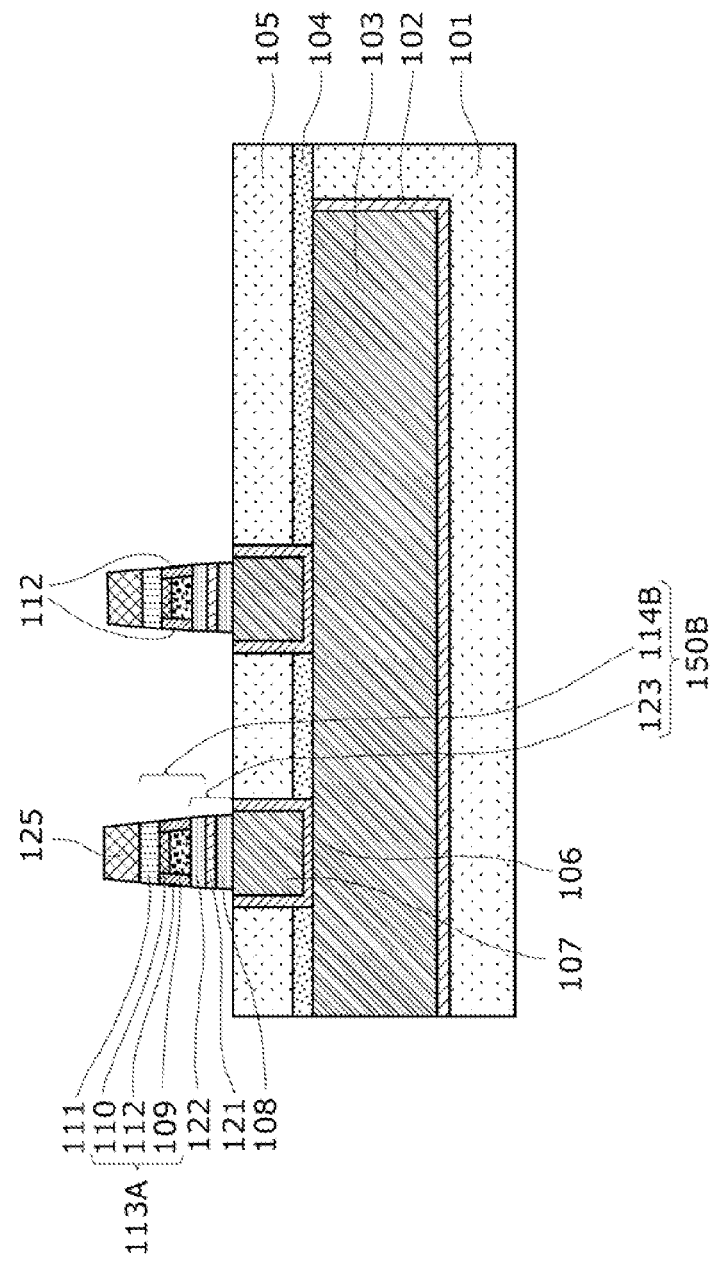
FIG. 20 is a cross-sectional view illustrating the method of manufacturing the nonvolatile memory device according to Embodiment 2 of the present invention.

Next, as illustrated in FIG. 20, the intermediate electrode layer 122a on the lower side of the stacked structure 150B, the semiconductor membrane 121a, and the first electrode layer 108a are fabricated into a dot shape similar to the mask 125 by dry etching, and finally, the mask 125 is removed. When a photoresist mask is used as the mask 125, the mask 125 may be removed by aching or wet etching. When a hard mask is used, the mask 125 may be removed by dry etching.

By forming the stacked structure 150A including the variable resistance element 114B and the diode element 123 by the above process, the effective cross-sectional area, through which current flows at the time of the initial breakdown of the variable resistance element 114B can be reduced by using the plasma oxidation method without reducing the effective cross-sectional area of the diode element 123.

Embodiment 3

Figure 21:
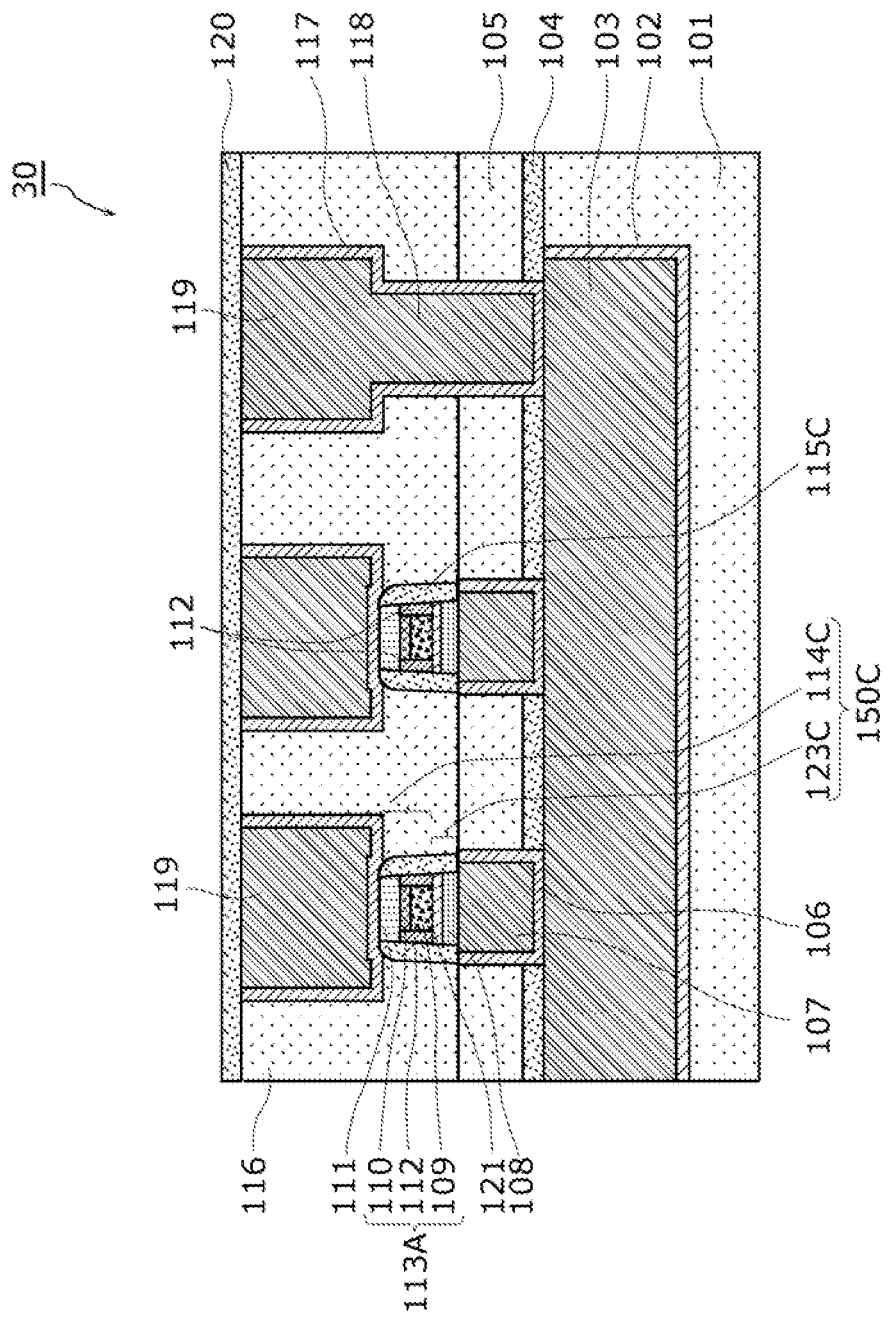
FIG. 21 is a cross-sectional view illustrating a configuration example of a nonvolatile memory device according to Embodiment 3 of the present invention.

FIG. 21 is a cross-sectional view illustrating a configuration example of a nonvolatile memory device 30 according to Embodiment 3 of the present invention.

The nonvolatile memory device 30 according to Embodiment 3 has a structure similar to that of the nonvolatile memory device 20 according to Embodiment 2, but has a configuration in which the intermediate electrode 122 is excluded from the configuration of Embodiment 2, the intermediate electrode 122 serving as the upper electrode of the diode element 123 and the lower electrode of the variable resistance element 114B.

The nonvolatile memory device 30 according to Embodiment 3 of the present invention is different from the nonvolatile memory device 20 of Embodiment 2 in that the side wall protective layer 115C is separately formed for each stacked structure 150C.

Because a material having a work function higher than that of the semiconductor layer 121 is used for the first electrode 108, a Schottky barrier is formed at the interface between the first electrode 108 and the semiconductor layer 121. Because a material having a work function higher than that of the semiconductor layer 121 is used for the variable resistance layer 113A (first variable resistance layer 109), a Schottky barrier is formed at the interface between the variable resistance layer 113A (first variable resistance layer 109) and the semiconductor layer 121. Thus, the variable resistance element 114C and the diode element 123C can be achieved with a stacked structure including four layers of the first electrode 108, the semiconductor layer 121, the variable resistance layer 113A, and the second electrode 111.

Consequently, the stacked structure 150C including the variable resistance element 114C and the diode element 123C can be made simple and thin in contrast to the nonvolatile memory device 20 illustrated in FIGS. 15 and 16. Accordingly, the influence of parasitic resistance can be reduced, and thus current density can be easily controlled. In addition, because fabrication accuracy also increases, a variation in dimensions can be reduced. Therefore, a variation in the density of the current which flows through the stacked structure 150C is reduced, and thus frequency of electrical failures decreases. Consequently, reduction in the yield of the nonvolatile memory device 30 can be prevented and the reliability can be increased.

By excluding the intermediate electrode 122, the stacked structure 150C can be made thin, and thus the step coverage performance of the side wall protective layer 115C which is formed on the side wall of the stacked structure 150C improves. Accordingly, the side wall protective layer 115C can be formed without a break on the side wall of the stacked structure 1500. Therefore, oxidation at the side wall of the variable resistance layer 113A can be further inhibited.

It is desirable to use oxygen-deficient tantalum oxide for the variable resistance layer 113A, and it is desirable to use nitrogen-deficient silicon nitride for the semiconductor layer 121.

The work function of tantalum as a simple substance is 4.2 eV, and the work function of tantalum oxide ($Ta_2O_5$) with stoichiometry of complete oxidation is 5.4 eV. Therefore, the work function of the oxygen-deficient tantalum oxide which is used for the variable resistance layer 113A is estimated to be in a range of 4.2 to 5.4 eV. Therefore, the work function of oxygen-deficient tantalum oxide is higher than the electron affinity of silicon, and a Schottky barrier is also formed at the interface between the variable resistance layer 113A (the first variable resistance layer 109) and the semiconductor layer 121, and thus the diode element 123C serves as a MSM diode.

In the above, an example has been described which uses the variable resistance layer 113A including the resistance layer 112, however, the variable resistance layer 113 not including the resistance layer 112 may be used as in the nonvolatile memory element 10 illustrated in FIG. 1.

In the present embodiment, the side wall protective layer 115C is separately formed for each stacked structure 150C, and the formation can be made in the following manner.

In the method of manufacturing the nonvolatile memory element 10 according to Embodiment 1 of the present invention, the stacked structure 150 including the variable resistance element 114 is formed as illustrated in FIG. 5, and after the formation of the side wall protective layer 115, the side wall protective layer 115 (on the second electrode 111 and the second interlayer insulating layer 105) other than the side wall portion of stacked structure 150C is removed by etching back the side wall protective layer 115.

When reactive ion etching (RIE) is used as a method for etching back the side wall protective layer 115 comprising silicon nitride, the etching rate in the ion incident direction (vertical direction) is, in general, absolutely higher than the etching rate in the non-incident direction (horizontal direction). Therefore, the side wall protective layer 115C remains only on the side wall portion of the stacked structure 150C.

The side wall protective layer 115C is separately formed for each stacked structure 150C, so that the side wall protective layer 115C is not present in the region where the stacked structure 150C is not formed. That is to say, the side wall protective layer 115C comprising silicon nitride is not present between the second interlayer insulating layer 105 comprising silicon oxide and the third interlayer insulating layer 116 comprising silicon oxide. Therefore, dry etching process can be easily performed to form the contact hole 118a for embedding and forming the drawer contact 118 at a predetermined position at which the stacked structure 150C is not formed.

In the above description, an example of the configuration has been described, in which the side wall protective layer 115C is separately formed for each stacked structure 150C in contrast to the aforementioned configuration of Embodiment 2. However, a similar exemplary configuration may be applied to the aforementioned configurations of Embodiment 1 and the modification of Embodiment 1.

In the above, the embodiments of the present invention have been described, however, the present invention is not limited to the above-described embodiments, and various improvements, changes, and modifications can be made without departing from the spirit of the invention.

For example, in the above description, part of the lower surface of the second metal line 119 is located under the upper surface of the second electrode 111 and over the lower surface of the second electrode 111, however, part of the lower surface of the second metal line 119 may be located under the lower surface of the second electrode 111. In other words, part of the lower surface of the second metal line 119 may be located under the upper surface of the variable resistance layer 113.

Figure 22:
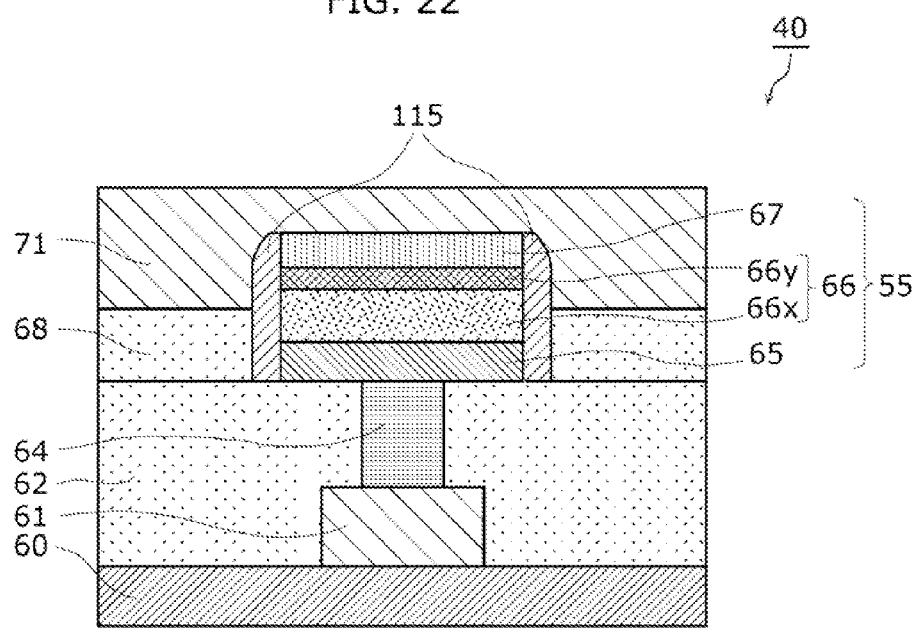
FIG. 22 is a cross-sectional view illustrating a configuration example of a nonvolatile memory device according to a modification of Embodiments of the present invention.
Figure 24:
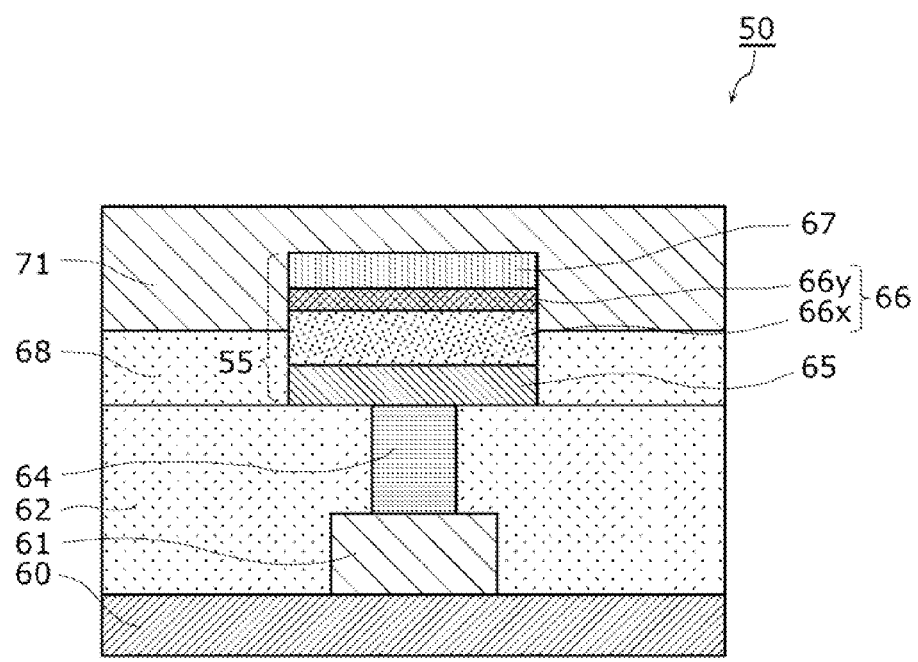
FIG. 24 is a structural cross-sectional view for explaining the problem of the conventional nonvolatile memory element.

FIG. 22 is a cross-sectional view of a nonvolatile memory device 40, illustrating an example in which the present invention is applied to the configuration of FIG. 24. In addition to the configuration illustrated in FIG. 24, the nonvolatile memory device 40 illustrated in FIG. 22 includes the side wall protective layer 115. The configuration and function of the side wall protective layer 115 are similar to those of the aforementioned embodiments. The side wall protective layer 115 is formed on the side wall portion of the stacked structure so as to cover the side wall of the stacked structure (the nonvolatile memory element 55). In FIG. 22, part of the lower surface of the second metal line 119 is located under the upper surface of the variable resistance layer 113 and over the lower surface of the variable resistance layer 113.

Here, in the configuration illustrated in FIG. 24, a leak path will be formed between the second metal line 71 and the variable resistance layer 66. On the other hand, as illustrated in FIG. 22, the formation of a leak path can be prevented by providing the side wall protective layer 115.

Any combination of the components in the aforementioned plurality of embodiments may be used.

In the embodiments described above, the case has been described, in which the transition metal oxide as the variable resistance layer is tantalum oxide, hafnium oxide, or zirconium oxide. However, the transition metal oxide layer interposed between the upper and lower electrodes may include an oxide layer as the main variable resistance layer which exhibits a resistance change, such as tantalum, hafnium, and zirconium layer, and may include, for example, very small amount of elements other than the above elements. A small amount of other elements may be intentionally included in the transition metal oxide layer for the purpose of fine adjustment of a resistance value, and such a case is also included in the scope of the present invention. For example, when nitrogen is added to the variable resistance layer, the resistance value of the variable resistance layer increases, and reactivity to a change in resistance can be improved.

Thus, in a variable resistance element which uses oxygen-deficient transition metal oxide for a variable resistance layer, when the variable resistance layer has a first region including a first oxygen-deficient transition metal oxide having a composition expressed by $MO_x$, and a second region including a second oxygen-deficient transition metal oxide having a composition expressed by $MO_y$, (x<y), the first region and the second region may contain a predetermined impurity (for example, an additive for adjusting a resistance value) other than the transition metal oxide with a corresponding composition.

When a resistive film is formed by sputtering, very small amount of undesired elements may enter the resistive film due to residual gas or gas discharged from a vacuum chamber wall, and the case where very small amount of such an element enter the resistive film is also included in the scope of the present invention.

The nonvolatile memory element according to the aforementioned embodiments is typically implemented as an LSI which is a large-scale integrated circuit. The LSI may be individually implemented as a single chip, or a single chip may include part or all of the LSIs.

In each the above figures, any corner or side of each component is illustrated using a linear segment, however, any corner or side of each component may be rounded or curved for the sake of manufacturing convenience, and those modified components are also included in the present invention.

All the numerical values used above are for the sake of specifically describing the present invention, and the present invention is not limited to the case with the illustrated numerical values. The materials of each component illustrated above are for the sake of specifically describing the present invention, and the present invention is not limited to the case with the illustrated materials.

INDUSTRIAL APPLICABILITY

The present invention may be applied to a variable resistance nonvolatile memory element, a nonvolatile memory device, and methods of manufacturing the variable resistance nonvolatile memory and the variable resistance nonvolatile device. The present invention is useful for various electronic devices which use a nonvolatile memory element and a nonvolatile memory device.

REFERENCE SIGNS LIST 10, 10A Nonvolatile memory element
20, 30, 40 Nonvolatile memory device
101 First interlayer insulating layer
102 First barrier metal layer
103 First metal line
104 First liner layer
105 Second interlayer insulating layer
106 Second barrier metal layer
107 Plug
108 First electrode
108a First electrode layer
109 First variable resistance layer
109a First variable resistance thin film
110 Second variable resistance layer
110a Second variable resistance thin film
111 Second electrode
111a Second electrode layer
112 Resistance layer
113, 113A Variable resistance layer
113a Variable resistance thin film
114, 114A, 114B, 114C Variable resistance element
115, 115C Side wall protective layer
116 Third interlayer insulating layer
117 Third barrier metal layer
118 Drawer contact
118a Contact hole
119 Second metal line
119a Line groove
120 Second liner layer
121 Semiconductor layer
121a Semiconductor thin film
122 Intermediate electrode
122a Intermediate electrode layer
123, 123C Diode element
125 Mask
150, 150A, 150B, 150C Stacked structure

The invention claimed is:

1. A nonvolatile memory element which includes a first electrode, a second electrode, and a variable resistance layer which (i) is interposed between the first electrode and the second electrode, (ii) comprises an oxygen-deficient metal oxide, and (iii) reversibly changes between a high resistance state and a low resistance state in which a resistance value is lower than a resistance value in the high resistance state, according to an electrical signal applied between the first electrode and the second electrode, the nonvolatile memory element comprising:
a first metal line;
a stacked structure which is formed above the first metal line, and includes the first electrode, the second electrode, and the variable resistance layer, one of the first electrode and the second electrode being electrically connected to the first metal line;
a second metal line which is formed on the stacked structure, and is directly connected, without use of a plug, to the other of the first electrode and the second electrode; and
a side wall protective layer which covers a side wall of the stacked structure without covering an upper surface of the stacked structure, the side wall protective layer having an insulating property and an oxygen barrier property;
wherein part of a lower surface of the second metal line is located under the upper surface of the stacked structure; and
wherein the variable resistance layer comprises
a first variable resistance layer comprising the metal oxide, and a second variable resistance layer comprising the metal oxide and having an oxygen content atomic percentage higher than an oxygen content atomic percentage of the first variable resistance layer.

2. The nonvolatile memory element according to claim 1, wherein the side wall protective layer comprises any one of an oxide, a nitride and an oxynitride.

3. The nonvolatile memory element according to claim 2, wherein the side wall protective layer comprises any one of a silicon nitride, an aluminum oxide, and a titanium oxide.

4. The nonvolatile memory element according to claim 1, wherein the variable resistance layer further includes:
a resistance layer which is formed on side walls of the first variable resistance layer and the second variable resistance layer, the resistance layer comprising the metal oxide and having an oxygen content atomic percentage higher than an oxygen content atomic percentage of the first variable resistance layer.

5. The nonvolatile memory element according to claim 1, wherein the variable resistance layer comprises any one of an oxygen-deficient tantalum oxide, an oxygen-deficient hafnium oxide, and an oxygen-deficient zirconium oxide.

6. The nonvolatile memory element according to claim 1, wherein the second electrode comprises any metal of iridium, platinum, palladium, copper, and tungsten, or a combination or an alloy thereof, and
a cross-sectional shape of the stacked structure is a trapezoid in which an angle formed by an extension line of the upper surface of the stacked structure and the side wall of the stacked structure is less than 90°.

7. A nonvolatile memory device comprising:
a plurality of the nonvolatile memory elements according to claim 1;
wherein, for each of the nonvolatile memory elements, the first metal line extends in a first direction;
wherein, for each of the nonvolatile memory elements, the second metal line extends in a second direction crossing the first direction;
wherein, for each of the nonvolatile memory elements, the stacked structure is constituted by a dot-shaped stacked structure; and
wherein each of the stacked structures is formed at corresponding one of three-dimensional cross-points of the first metal lines and second metal lines.

8. The nonvolatile memory device according to claim 7, wherein the side wall protective layer is separately formed for each of the stacked structures.

9. The nonvolatile memory device according to claim 7, wherein, for each of the nonvolatile memory elements, the stacked structure further includes:
a semiconductor layer formed between the first electrode and the variable resistance layer and connected to the first electrode; and
an intermediate electrode interposed between the semiconductor layer and the variable resistance layer,
wherein, for each of the nonvolatile memory elements, the first electrode, the semiconductor layer, and the intermediate electrode are included in a diode element, and
wherein, for each of the nonvolatile memory elements, the intermediate electrode, the variable resistance layer, and the second electrode are included in a variable resistance element.

10. The nonvolatile memory device according to claim 9, wherein, for each of the nonvolatile memory elements, the semiconductor layer comprises a nitrogen-deficient silicon nitride.

11. The nonvolatile memory device according to claim 7, wherein, for each of the nonvolatile memory elements, the stacked structure further includes a semiconductor layer formed between the first electrode and the variable resistance layer and connected to the first electrode and the variable resistance layer, and
wherein, for each of the nonvolatile memory elements, the first electrode and the variable resistance layer each comprise a material having a work function higher than a work function of the semiconductor layer.

12. The nonvolatile memory device according to claim 7, wherein, for each of the nonvolatile memory elements, part of the lower surface of the second metal line is located under an upper surface of the variable resistance layer.

13. The nonvolatile memory element according to claim 1, wherein the second metal line is directly connected to the entire upper surface of the stacked structure.

14. The nonvolatile memory element according to claim 1, wherein the side wall protective layer covers the entire side wall of the stacked structure.

15. The nonvolatile memory element according to claim 1, wherein part of the lower surface of the second metal line is located under an upper surface of the side wall protective layer.

16. The nonvolatile memory element according to claim 1, wherein a width of the second metal line is greater than a width of the stacked structure.

17. The nonvolatile memory element according to claim 1, further comprising
a plug which is formed on the first metal line and is connected to the first metal line,
wherein the stacked structure is formed on the plug which is connected to one of the first electrode and the second electrode.

* * * * *